US008443319B2

(12) United States Patent
Nodine

(10) Patent No.: US 8,443,319 B2
(45) Date of Patent: May 14, 2013

(54) METHOD FOR PREPARING RE-ARCHITECTED DESIGNS FOR SEQUENTIAL EQUIVALENCE CHECKING

(75) Inventor: Mark H. Nodine, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/128,153

(22) PCT Filed: Oct. 28, 2009

(86) PCT No.: PCT/US2009/062337
§ 371 (c)(1),
(2), (4) Date: May 6, 2011

(87) PCT Pub. No.: WO2010/053779
PCT Pub. Date: May 14, 2010

(65) Prior Publication Data
US 2011/0214097 A1    Sep. 1, 2011

Related U.S. Application Data

(60) Provisional application No. 61/112,537, filed on Nov. 7, 2008.

(51) Int. Cl.
*G06F 9/455*    (2006.01)
(52) U.S. Cl.
USPC .......................... 716/107; 716/103; 716/106
(58) Field of Classification Search ............... 716/106, 716/103, 107; 714/726
See application file for complete search history.

(56) References Cited

U.S. PATENT DOCUMENTS

| | | | |
|---|---|---|---|
| 7,137,084 B1 | 11/2006 | Chen et al. | |
| 2002/0123873 A1 | 9/2002 | Roesner et al. | |
| 2003/0225557 A1 | 12/2003 | Barrett et al. | |
| 2006/0052994 A1 | 3/2006 | Takei | |
| 2008/0028347 A1* | 1/2008 | Hiraoglu et al. | 716/5 |
| 2008/0209287 A1* | 8/2008 | Baumgartner et al. | 714/726 |
| 2009/0293028 A1* | 11/2009 | Hiraoglu et al. | 716/5 |
| 2011/0307848 A1* | 12/2011 | Yeung et al. | 716/103 |

OTHER PUBLICATIONS

International Search Report and Written Opinion for PCT/US2009/062337, mailed Dec. 28, 2009, 13 pages.

* cited by examiner

*Primary Examiner* — Thuan Do
*Assistant Examiner* — Mohammed Alam
(74) *Attorney, Agent, or Firm* — Meyertons, Hood, Kivlin, Kowert & Goetzel, P.C.

(57) ABSTRACT

This disclosure describes a method illustrated in FIG. 7 to prepare re-architected digital logic designs for sequential equivalence checking. This method initially begins with a description of an electrical design module that includes a plurality of ports, and a description of an electrical reference model that comprises a hierarchy of one or more reference modules where each said reference module comprises a plurality of internal signals. In addition, this method includes a configuration file with additional initial information. The method then processes 100 a configuration file. Then, the method 105 computes one or more output files. Finally, the method 110 writes the output files.

20 Claims, 30 Drawing Sheets

METHOD FOR PREPARING RE-ARCHITECTED DESIGNS FOR SEQUENTIAL EQUIVALENCE CHECKING

TECHNICAL FIELD

This invention is in the field of verification of semiconductor integrated circuit design in general, and more specifically when verifying that a design that has been modified using sequential optimization techniques is equivalent to its original design. This invention creates circuitry for taking dissimilar but comparable designs so that they can be compared with commercial sequential optimization tools.

BACKGROUND ART

Functional validation (verification) of complex IC designs is an activity that currently consumes a majority of the engineering man-hours for creating a design. The process of verification entails checking the output of a design implementation with that expected by some design reference model.

Verification of semiconductor chips can be done either through simulation or using formal methods. Simulation verification involves running a set of tests on the design and comparing the results of those tests with a reference model that produces the desired results.

A formal verification method is distinguished from simulation verification in that it uses mathematical models of the circuits to prove a property of interest rather than relying upon simulations of individual test cases. The advantage of a formal method is that, when it works, it is equivalent to doing an exhaustive simulation of every possible test case. Exhaustive simulation by itself is not practical for any but the most trivial of circuits because of the size of the state space.

Formal methods use a number of techniques to accomplish their mathematical proofs, including binary decision diagrams (BDDs), ordered BDDs, symbolic trajectory analysis (STA), satisfiability solvers (SAT), and bounded satisfiability solvers. The common thread in all these techniques is that they are algorithms for problems that, in computer science terms, are NP-complete. Without going into details, despite years of research, nobody has ever been able to solve an NP-complete problem with any algorithm whose worst-case run time does not grow exponentially in the size of the input. People therefore have to rely on heuristics to try to solve the problems in a reasonable time.

One important type of formal method is equivalence checking, which is used to verify that two circuits perform the same function. One of these circuits is considered to be the reference model specifying the ideal behavior of the circuit; the other circuit is a design model whose behavior is to be compared to the reference model. An example is comparing a register transfer level (RTL) circuit with the results of synthesizing it into a gate-level netlist. With equivalence checking, a design project could do most of its verification simulation cycles on the RTL design, which simulates more quickly, and then use equivalence checking to ensure that no bugs were introduced during synthesis.

For two circuits to be the same, each must have the same number of primary inputs (PIs) and the same number of primary outputs (POs), and there must be some way to identify corresponding inputs/outputs. Commercial combinational equivalence tools also require a complete correspondence between internal sequential elements (latches or flops) of the two designs. Based upon this matching, these tools convert the combinational circuit connecting any two corresponding pairs of state-holding elements into a canonical form like a binary decision diagram and compare for equality. If any pair of corresponding combinational circuits does not match, then the equivalence fails. By using correspondence points, the tools are able to keep the size of combinational circuits to be handled at any one time to a minimum, virtually eliminating capacity issues caused by the NP-completeness of the underlying problem.

Unfortunately, this view of equivalence is too restrictive to handle many transformations that are useful for optimizing speed or power. There are many modifications to a circuit that maintain the equality of computation at the PIs and POs while breaking the correspondence of circuits between sequential elements, such as:

1. Recoding of state machines
2. Retiming by moving logic across latch boundaries
3. Clock gating
4. Pipeline stage insertion/removal
5. Resource allocation The generalized problem where matching of sequential elements cannot be assumed is referred to as sequential equivalence checking, which is an active area of research. The sequential equivalence checking problem space is much harder than that of combinational equivalence checking, so application of any algorithms for proving sequential equivalence may fail due to resource limitations.

When optimizing a design module, it is not necessary for the outputs to match in the case of invalid inputs. To address this issue, commercial sequential equivalence tools allow sets of input constraints to be specified. Ideally, the input constraints specify exactly the legal input space for the design to be verified. Unfortunately, the constraints themselves are subject to human error and require verification. If an overly restricted set of constraints is specified, then two designs may compare as equivalent even though they may have different outputs for legal inputs that were incorrectly excluded by the input constraints.

Likewise, it is not necessary for an output of a optimized design module to match the reference model during any time period when the output is not valid. For example, the data lines coming out of a memory module only have to match when a read operation on the memory causes the data to be read. To allow checking to be suppressed during times when an output is not valid, commercial sequential equivalence checking tools allow circuitry that computes a valid mask to be specified so that checking is disabled when the valid mask does not have the value encoding Boolean TRUE.

To meet aggressive timing goals, it is often necessary to modify the boundaries of modules and/or change the signal timing on the inter-module boundaries. Some signals may also be re-encoded in the optimized design relative to the original design.

If it were possible to run equivalence checking on the top-level design, nothing else would be necessary. However, because of capacity issues with sequential equivalence checking tools, it is necessary to break up the design into smaller parts and use blackboxes. FIG. 1 illustrates how blackboxing works. Assume that module B has already been shown equivalent to its corresponding reference module and that module A instantiates module B with three inputs and two outputs. Then we do a formal equivalence check of A treating the inputs of B as if they were POs of A and the outputs of B as if they were PIs of A, with the analogous blackboxing taking place in the reference model against which the design is being proved equivalent. Global equivalence is achieved by verifying the equivalence over all the optimized design modules.

As mentioned above, in order for formal equivalence checking tools to work, the tools require the two modules to have identical PIs and POs. However, when decomposing equivalence checking hierarchically, there may be design modules that differ from the reference model due to changed boundaries, retimed ports, or encoded ports. All the information on how a module's boundary is redrawn, retimed, and encoded is contained in the module's configuration file which is an input to the disclosed invention.

This method reads a reference model, reads the configuration file for an optimized design module and creates a set of modified reference modules and a pair of wrappers such that the wrappers have the same PIs and POs with identical timing, but one encapsulates the reference model and the other the design module. If the two wrappers are proved equivalent, this proof guarantees that the design module faithfully implements the interface changes specified in its configuration file.

The configuration file for a design module contains the following information for each of the design module's ports:

1. A reference connection that specifies how to create the equivalent of the design module port based on some Boolean combination of signals within the reference model.
2. An encoding function, defaulting to the identity function, translating the reference connection to the design module port. An encoding function is a special case of a Boolean combination, specifically one for converting a multi-bit signal to a different representation. An example of an encoding function is to convert a binary encoding to a one-hot encoding. Encoding functions are a mere convenience and do not add any additional domain of applicability to the disclosed invention.
3. A delay value, in units of clock cycles, defaulting to 0, for how the timing of the design module port relates to that of the reference connection, in an embodiment of this invention that supports delays. Positive values mean that the design module port changes later than the reference connection and negative values that it changes earlier.
4. A valid mask that is a Boolean expression, defaulting to Boolean TRUE, possibly containing references to signals within the reference model, which specifies when the value of an output port is expected to match its reference expression, in an embodiment of the disclosed invention that supports valid masks.

This application claims the benefits of the earlier filed U.S. Provisional Application Ser. No. 61/112,537, filed 7 Nov. 2008, which is incorporated by reference for all purposes into this specification.

SUMMARY OF INVENTION

This invention is a method for creating circuitry for comparing a re-architected logic design against some sub-circuit within a reference model for use with a sequential equivalence checking tool.

The actual equivalence checking is done between a set of top-level wrapper files with identical primary inputs (PIs) and primary outputs (POs), one encapsulating the reference model and one the design module. For example, suppose we have a reference module B and a design instance b that differ only in that the inputs and outputs of b have some encoding function(s) applied to them relative to those of B, illustrated schematically in FIG. 2. The outputs of the disclosed invention are a reference wrapper WR and a design wrapper WD wrapping B and b, respectively, with the encoding functions, which are represented by an "f" in a circle, inserted so that the inputs and outputs correspond exactly.

Sometimes one or more modules in the reference model whose signals are referred to in a design module's reference connections are not top-level modules. To allow access to signals that are within internal modules of the reference model, the disclosed invention needs to generate a set of hierarchical modules called hierarchical override files that mimic the reference modules, except that they contain additional ports that pass through to lower levels of the hierarchy. The module immediately above the corresponding reference module needs to be rewritten so as to disconnect any input ports from their surrounding module and connect them instead to newly introduced inputs.

As a simple example, suppose that the reference module B to which design module b corresponds is instanced by reference module C, which is used as the reference model, as shown in FIG. 3. Suppose that B has three inputs i1, i2, and i3 along with two outputs o1 and o2. The disclosed invention outputs a reference wrapper WR and a design wrapper WD. To pass inputs to i1, i2, and i3 of B, the disclosed invention needs to produce a modified version C' of module C which contains extra ports that are wired through to the inputs of B, replacing the previous inputs from C. Similarly, C' needs to contain extra output ports to export the values of o1 and o2 to the reference wrapper. Encoding functions are applied equivalently to FIG. 2. Although this example has illustrated an override file for only a single level of hierarchy, this concept extends naturally to multiple levels.

We now explain how to handle cases where a design module's boundaries are redrawn relative to those of the reference model, i.e., there does not exist any one module in the reference corresponding to the design module.

Consider first the case of a design module b that has had some logic removed relative to reference module B as illustrated in FIG. 4. In the simplest case, the ports of b correspond to either ports or internal signals in B. Suppose, for example, that b has inputs 1' and 2' that correspond to inputs 1 and 2 of B and input 3' that corresponds to internal signal m. Suppose also that it has an output x' corresponding to an encoded version of internal signal n of B. Then the disclosed invention produces a reference wrapper WR and a design wrapper WD together with a module B' which is the same as module B except that it has an extra input port to drive internal signal m, which is disconnected from all the logic that previously drove it. B' also contains a new output port to access signal n. The wrapper then treats these newly created ports the same way as the original ports.

This situation is a specific case of the more general one where new ports of b are identified with a Boolean combination of signals within B. FIG. 5 illustrates this case assuming that b has an input port identified as the AND of m1 and m2 and an output port identified as the AND of n1 and n2; this technique generalizes to any Boolean combination of any number of signals.

Next, we show how to handle the case of modules with additional logic as shown in FIG. 6. In this figure, suppose that design module b encompasses all of reference module B along with some parts of predecessor module A and successor module C. Suppose also that D is some design module containing A, B, and C (there may be intervening levels of hierarchy). Then the disclosed invention produces two wrappers WR and WD, as before, as well as a new version D' of D (along with all the intervening levels of hierarchy that may be needed to reach A and B), which has been modified to have additional input ports to reach the inputs of B that correspond to those of b and the internal signals of A that are identified with input ports of b, and to have additional output ports to export the outputs of B that correspond to those of b and the internal signals of C that are identified with output ports of b. It must also output a modified version A' of A with extra input ports needed to drive its internal signals that are identified with input ports of b, having disconnected those internal signals from their driving logic and connected them instead to the newly-created ports, as well as a modified version C' of C with extra output ports to export its internal signals that are identified with output ports of b. (A', C', and D' are examples of hierarchical override files.) WD passes its PIs through their appropriate encoding functions relative to the corresponding signals in WR. WR likewise passes the outputs of D' corresponding to output ports of b through their encoding functions prior to wiring them to its POs.

For expository reasons, the above discussion has separated the case where a design module implements less logic than some corresponding reference module from that where it implements more logic. However, it is straightforward to extend these examples for the following generalizations:

1. Having some logic added and other logic removed.
2. Having multiple predecessor or successor reference modules, some of whose logic is included into a design module.
3. Having a design module that implements the entirety of several reference modules.
4. Having a reference module that is partitioned among multiple design modules.
5. Having ports that correspond to Boolean combinations of signals for either added or removed logic.

In one embodiment of the disclosed invention, a configuration file can specify retimed ports: any port of the design module can be delayed by some integral number of cycles relative to its reference connection. A negative delay means that the design port transitions earlier than the corresponding reference connection.

The disclosed invention handles retimed ports by computing the maximum negative delay of any of the design input ports and taking this time as the base input time for both the reference and design wrappers. The appropriate number of flops is inserted for any input that is not of the maximum negative delay. In the case of the reference model, all input ports by definition have a delay of zero. Delays on outputs are handled by introducing extra flops in the design wrapper, if the delay is positive, and in the reference wrapper, if the delay is negative.

One embodiment of the disclosed invention handles input constraints by instantiating constraint modules in the wrappers whose purpose is to input one or more unconstrained reference signals and to output one or more constrained reference signals.

One embodiment of the disclosed invention handles valid masks which constrain output checking by storing them in a separate file which may be used by a sequential equivalence tool.

BRIEF DESCRIPTION OF DRAWINGS

To further aid in understanding the invention, the attached drawings help illustrate specific features of the invention and the following is a brief description of the attached drawings.

DISCLOSURE OF EMBODIMENTS

The present invention is a method to prepare re-architected digital logic designs for sequential equivalence checking. This disclosure describes numerous specific details in order to provide a thorough understanding of the present invention. One skilled in the art will appreciate that one may practice the present invention without these specific details. Additionally, this disclosure does not describe some well known items in detail in order not to obscure the present invention.

Figure 33:
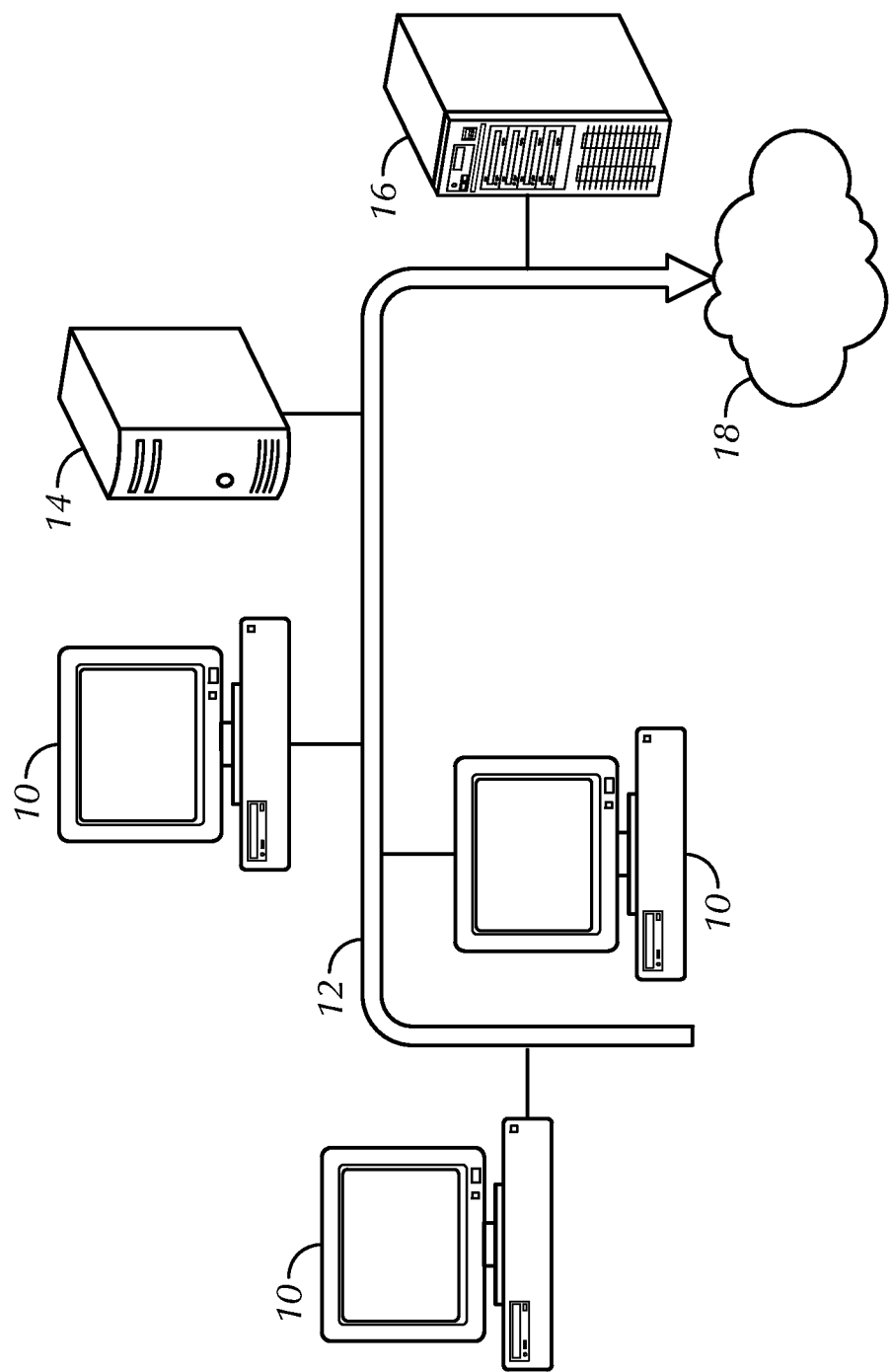
FIG. 33 illustrates the invention in a typical networked environment.

FIG. 33 illustrates the use of the present invention in a typical networked environment. The invention is a software program that runs on one or more workstations 10 in a networked environment. The various workstations 10 couple to a network 12 where they may communicate with each other. Additionally, the networked environment may include a shared storage device 14 and a network server 16. And, the networked environment may couple to the Internet 18. In addition to being able to operate on one or more workstations 10, the invention may use the resources of the shared storage device 14 and the network server 16. The invention may also use resources available through the Internet 18. One embodiment of the invention uses a Linux-based standalone workstation 10 and uses the interpretive language PERL and TCL. One skilled in the arts will appreciate the invention is capable of using other languages for operation and that it may be hosted on other operating systems.

Figure 8:
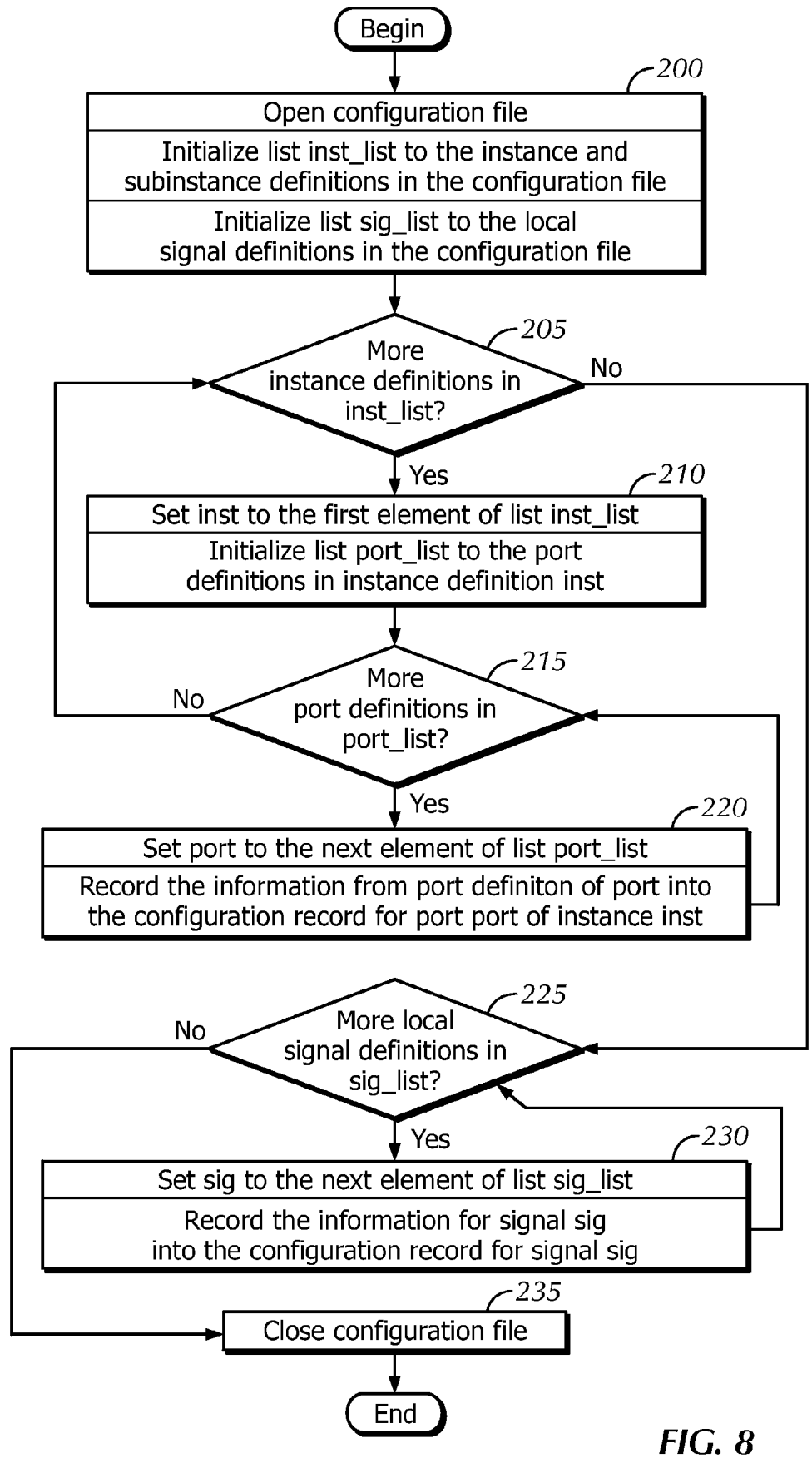
FIG. 8 illustrates the method of Box 100 of FIG. 7.

The disclosed invention starts in Box 100 which processes the configuration file using the method of FIG. 8. Next, the disclosed invention computes the contents of the wrapper and other output files in Box 105. The method for accomplishing Box 105 is given in FIG. 9. Finally, the output files are written in Box 110, whose method is described in FIG. 30.

A configuration file contains one top-level instance definition, which contains a plurality of port definitions. An instance definition specifies the name of the design module to be checked against the reference model. In one embodiment of the disclosed invention, the configuration file can also specify a plurality of sub-instances definitions of a design module for which blackboxes can be created; these sub-instance definitions contain the same information as an instance definition except that they additionally specify a hierarchical path through the design module.

A port definition contains the following pieces of information:

1. A name for which port is being described, corresponding to one of the named ports of the design module.
2. A reference connection, which establishes a definition of the port of the design module in terms of internal signals of the reference model:
   a. The reference connection can be a Boolean combination of a plurality of signals within a plurality of reference modules and the Boolean constants 0 and 1.
   b. In one embodiment of the disclosed invention, the reference connection for an input port of the design module can be preprocessed by an input constraint module.
   c. In one embodiment of the disclosed invention, a reference connection can use local signals specified in a High-level Definition language (HDL) such as VHDL or Verilog, where each locally defined signal is driven using a Boolean combination of a plurality of signals within a plurality of reference modules and the Boolean constants 0 and 1.
3. An encoding function which specifies how the connection is to be encoded to correspond to the port of the design module. Such an encoding function is merely a convenient alternative way of specifying all or part of the Boolean combination. It is not a fundamental component of the disclosed invention.
4. In one embodiment of the disclosed invention, a delay which specifies by how many clock cycles the reference connection must be delayed to correspond to the port of the design module. This delay can be negative.

Figure 1:
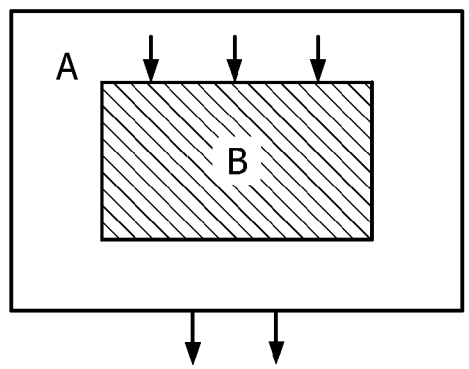
FIG. 1 illustrates decomposing equivalence checks using blackboxes.
Figure 2:
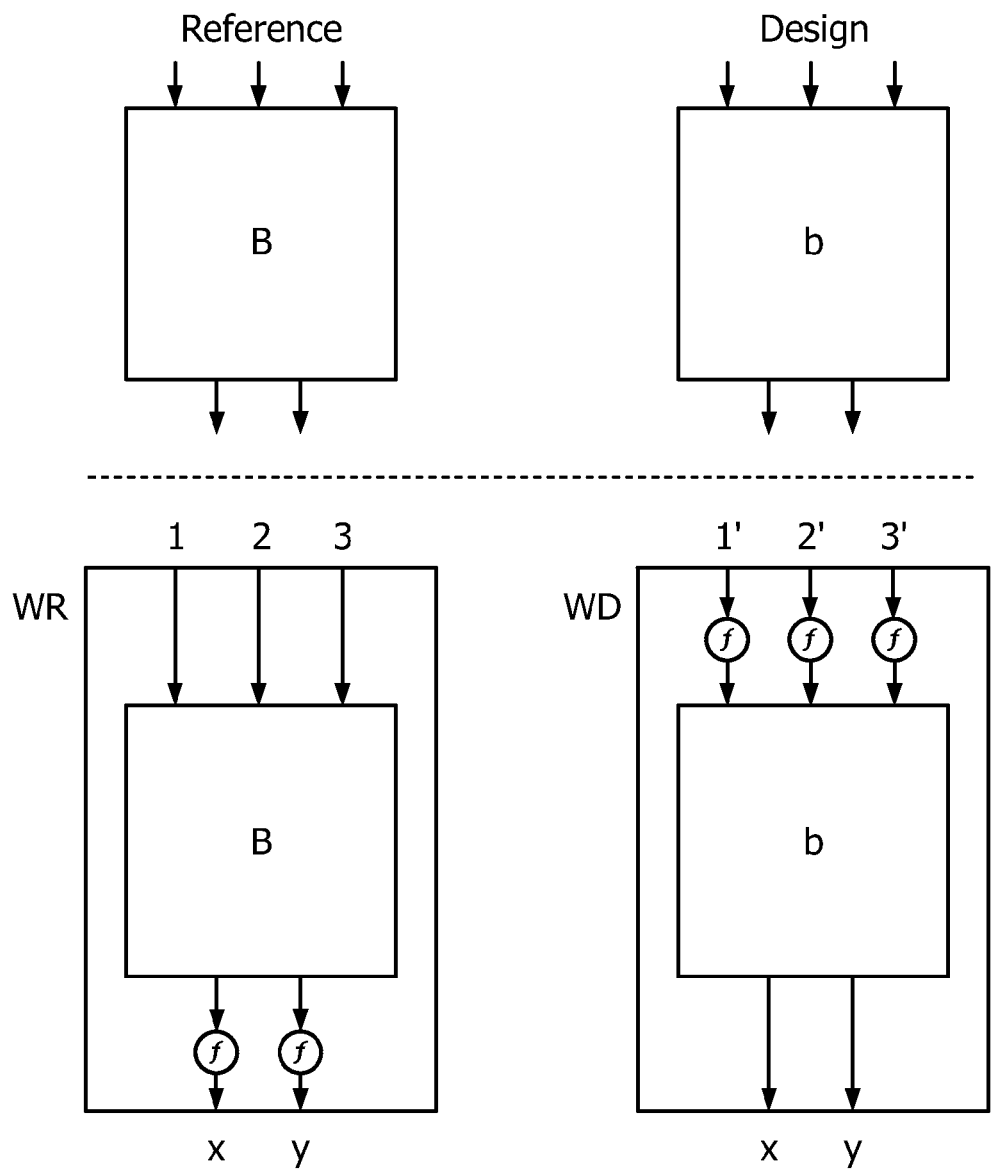
FIG. 2 illustrates a simple example using wrappers for encoding functions.
Figure 3:
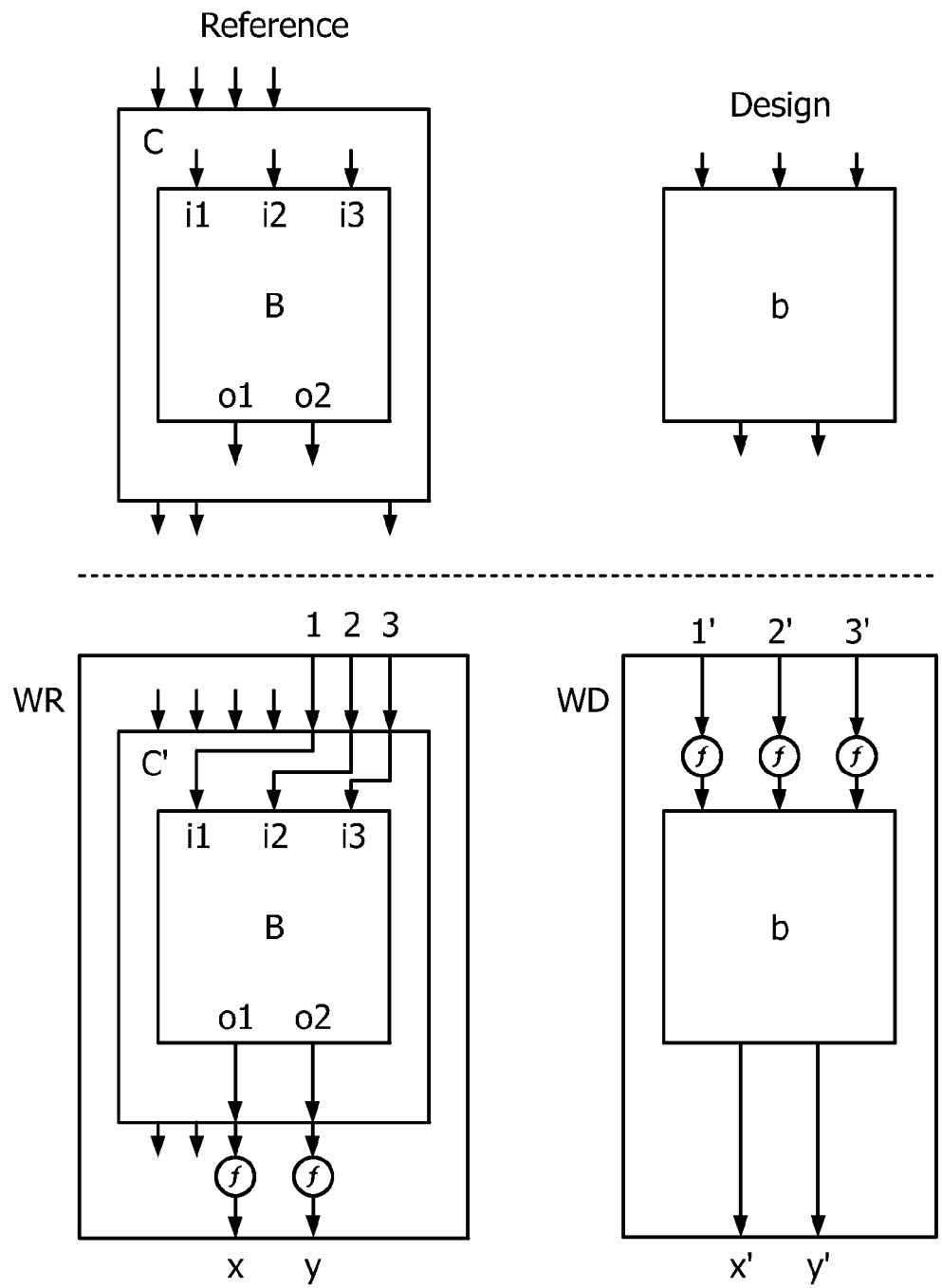
FIG. 3 illustrates an example of a hierarchical override file.
Figure 4:
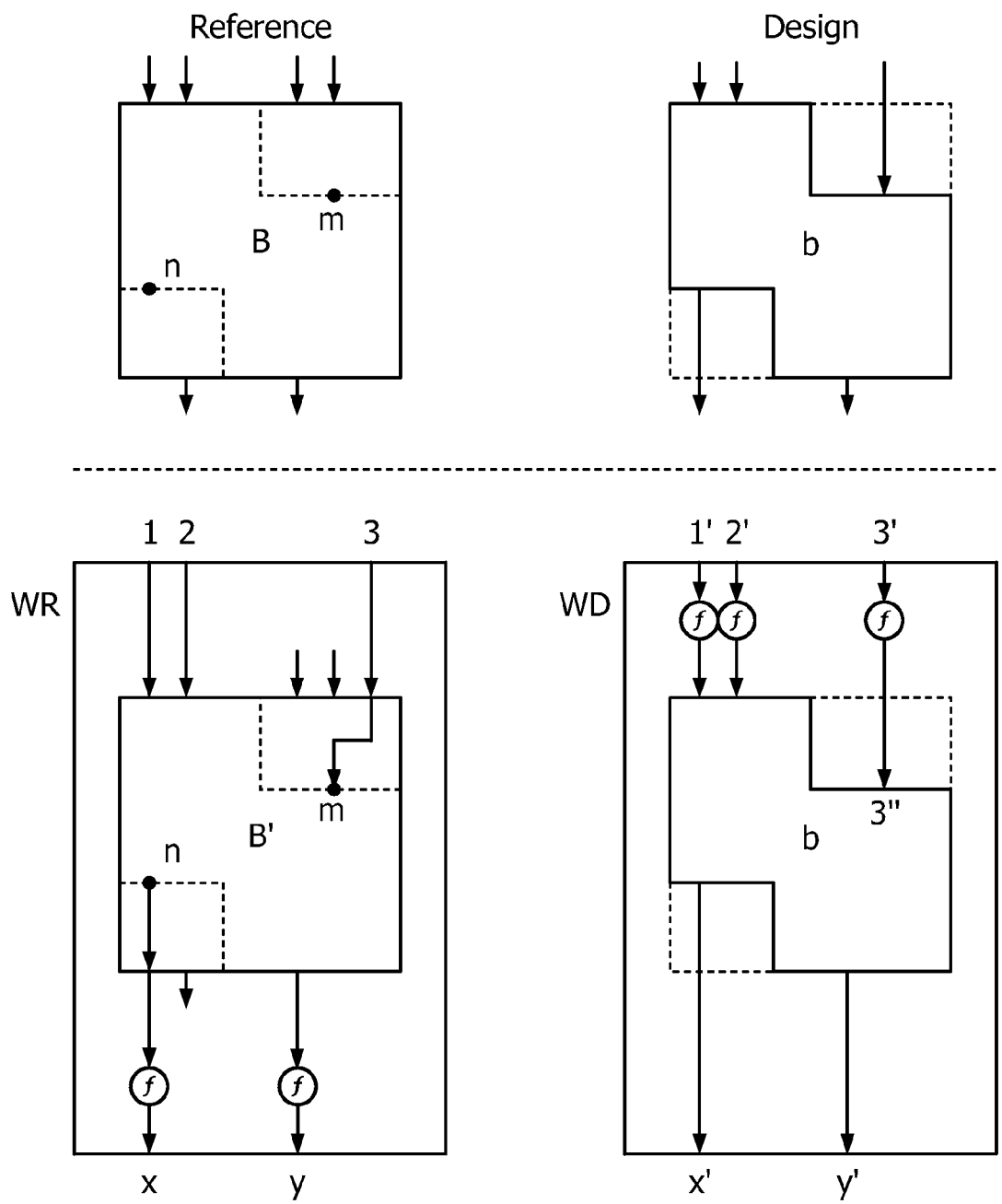
FIG. 4 illustrates a design module corresponding to a reference module with logic removed.
Figure 5:
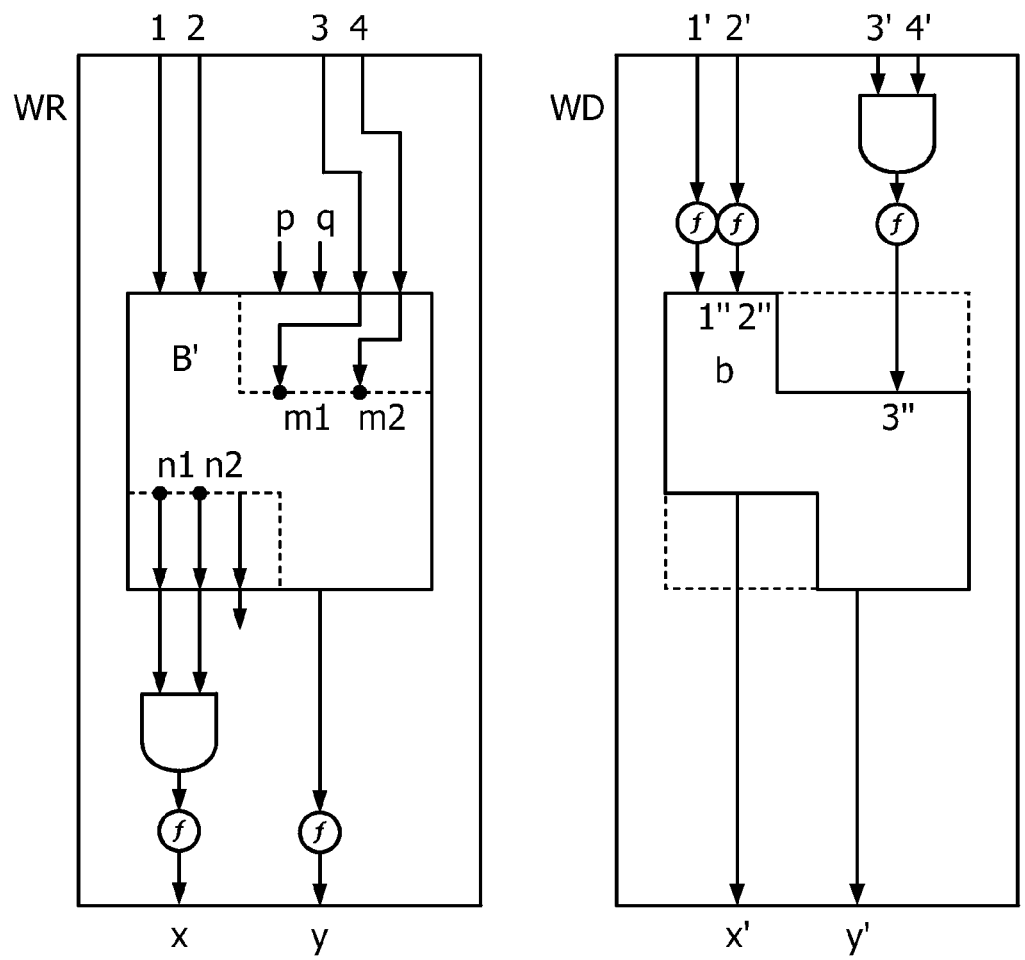
FIG. 5 illustrates identifying ports with combinations of internal signals in a reference module.
Figure 6:
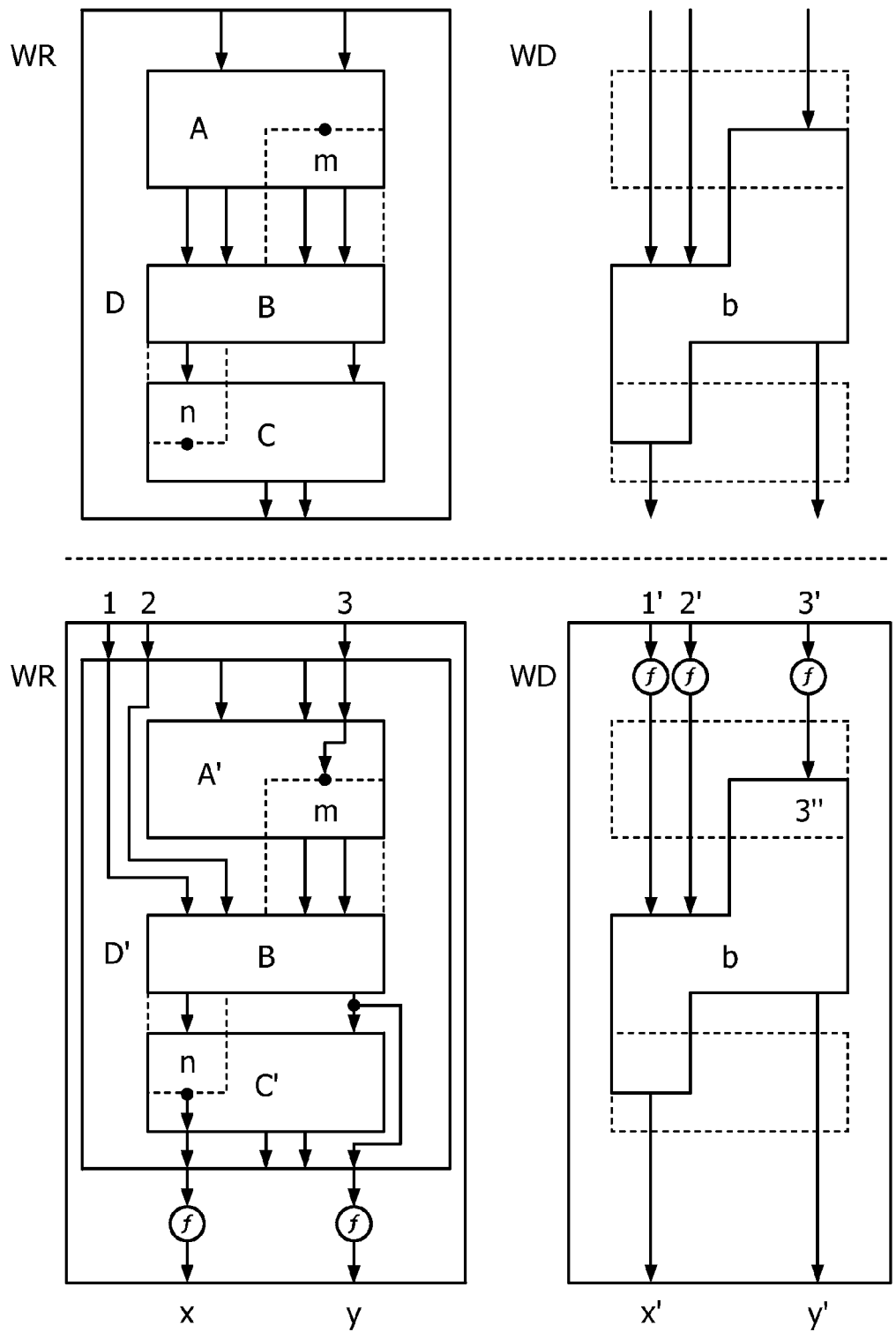
FIG. 6 illustrates a design module corresponding to a reference module with logic added.
Figure 7:
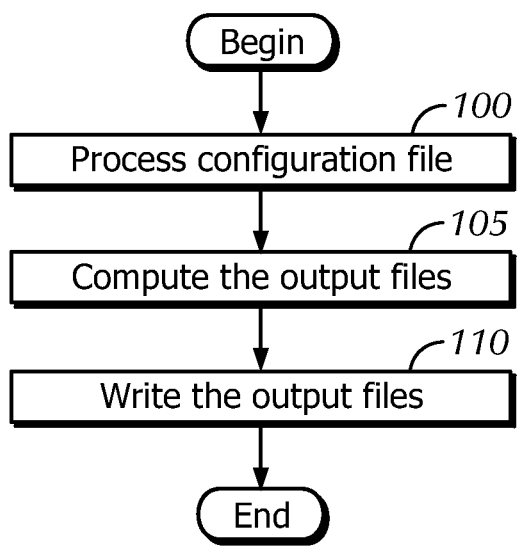
FIG. 7 illustrates the top-level flow chart of the disclosed invention.

FIG. 8 illustrates the method of Box 100 of FIG. 7 that encompasses all the embodiments above. The purpose of this method is to process the configuration file and store the information into a set of configuration records.

In Box 200, we open the configuration file and initialize list inst_list to the top level instance definition and, for an embodiment of this invention that supports blackboxing of sub-instances, the sub-instance definitions from the configuration file. We also initialize list sig_list to the list of local signal definitions in the configuration file for an embodiment of this invention that supports local signals. Then, in Box 205, we check whether there are any unprocessed instance definitions in list inst_list. If there are not, we go to Box 225. If there are, we go to Box 210, where we set inst to the first unprocessed element of inst_list, initialize list port_list to the set of port definitions that the instance definition for instance inst contains and proceed to Box 215, which asks if there are any unprocessed port definitions in list port_list. If there are not, we return to Box 205; otherwise we proceed to Box 220, where we set port to the next unprocessed port definition of list port_list and record all the information from the port definition associated with port port into the configuration record for port port of instance inst before returning to Box 215.

Taking up from Box 225, we ask if there are any unprocessed local signal definitions in list sig_list. If there are not, we go to Box 235, where we close the configuration file and exit; otherwise, we got to Box 230, where we set sig to the next unprocessed local signal definition in list sig_list and record the information for defining and driving signal sig in the configuration record for signal sig. We then return to Box 225.

Figure 9:
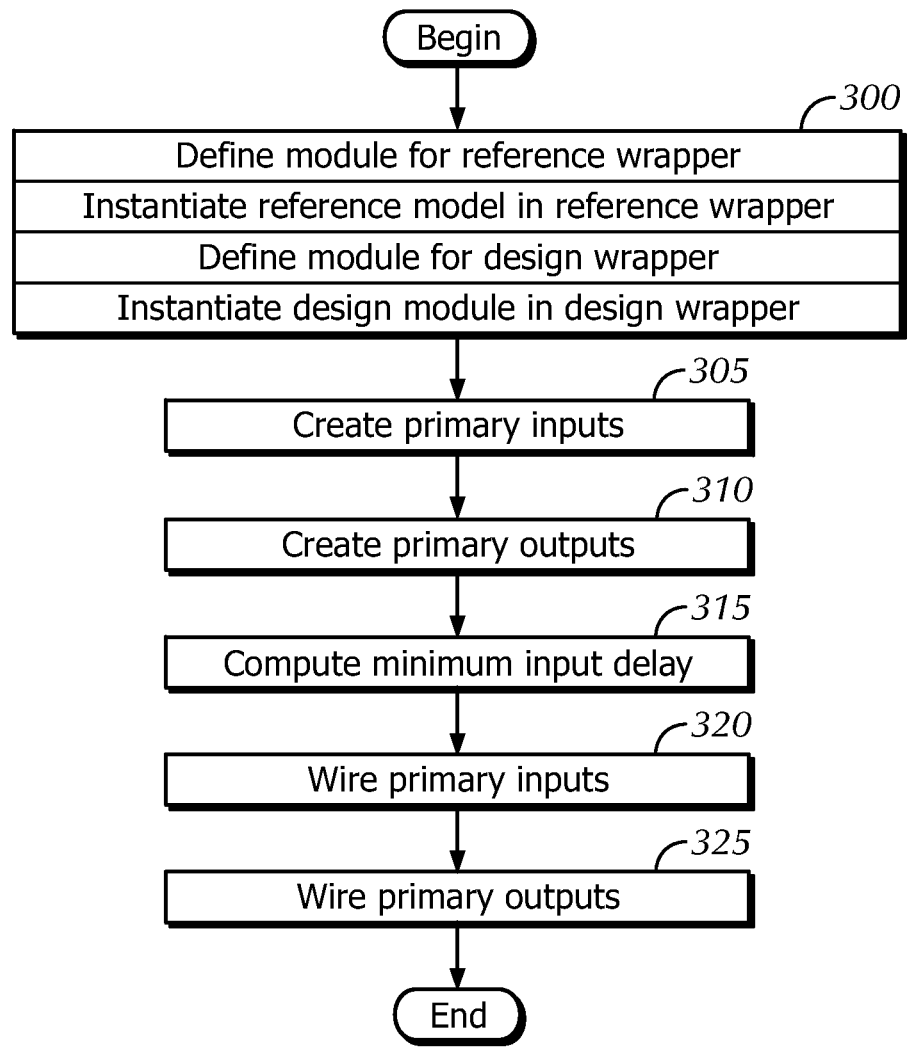
FIG. 9 illustrates the method of Box 105 of FIG. 7.

FIG. 9 shows the method of Box 105 of FIG. 7. The purpose of this method is to compute the contents of all the output files that are needed for performing sequential equivalence checking.

Figure 17:
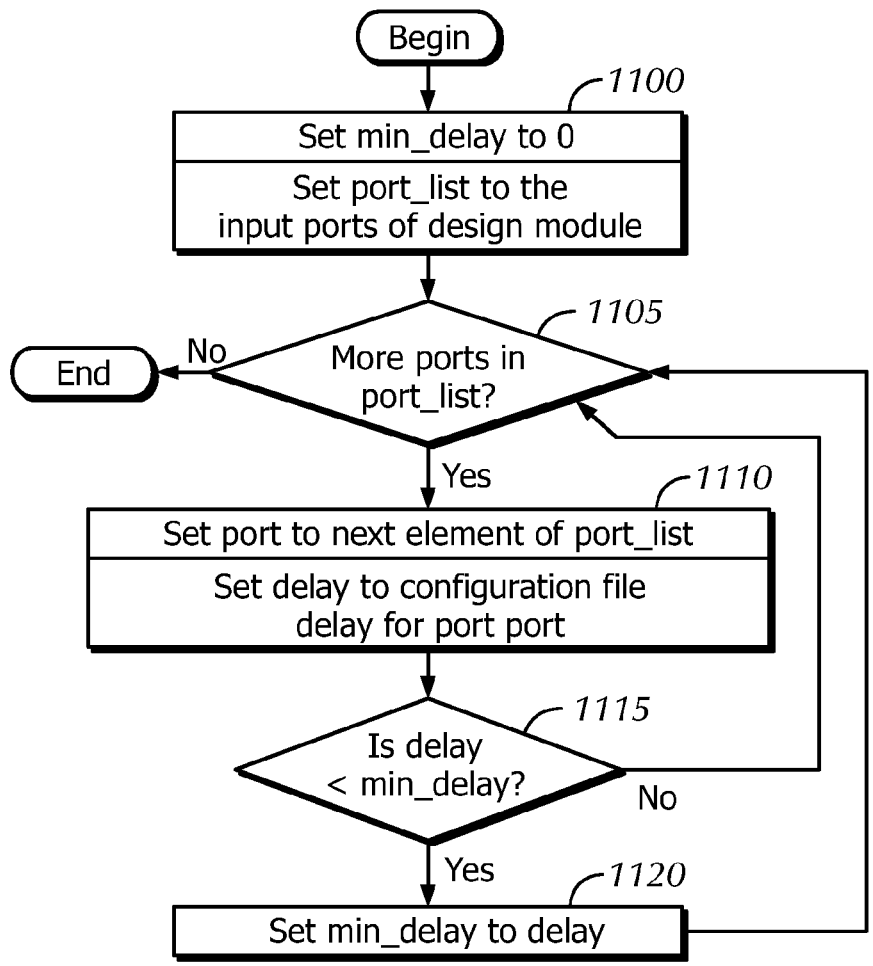
FIG. 17 illustrates the method of Box 315 of FIG. 9.

In Box 300, we define a new module for reference wrapper and instantiate the reference model in it. We also define a new module for the design wrapper and instantiate the design module in it. Next, Box 305 computes the primary inputs for both wrappers using the method of FIG. 10 and Box 310 creates primary outputs for both wrappers using the method of FIG. 14. We then proceed to Box 315 in which we compute the minimum delay of all the input ports of the design module, the method of accomplishing which is illustrated in FIG. 17. Next, Box 320 uses the method of FIG. 18 to create wires driven by the primary inputs of the wrappers and Box 325 uses the method of FIG. 26 to drive the primary outputs of the wrappers.

Figure 10:
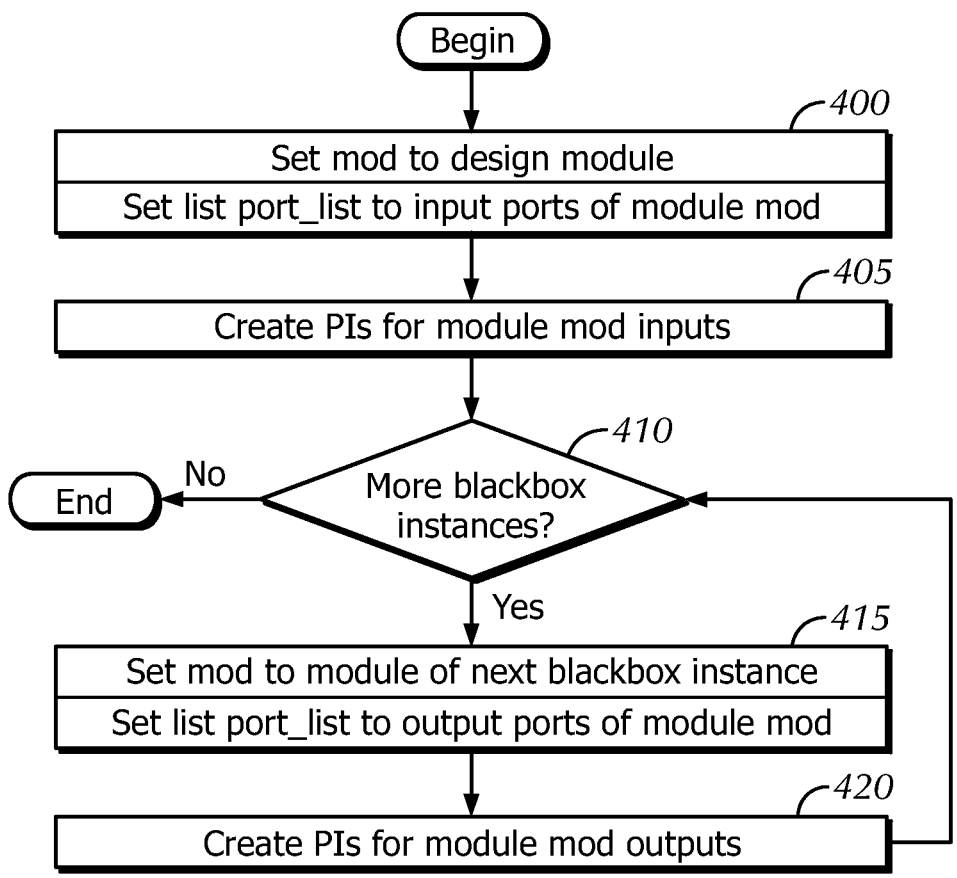
FIG. 10 illustrates the method of Box 305 of FIG. 9.

FIG. 10 shows the method of Box 305 of FIG. 9. The purpose of this method is to create the set of primary inputs that are used for both the reference wrapper and the design wrapper.

This method starts in Box 400 by setting the variable mod to contain the design module and list port_list to contain the list of input ports of module mod. Next, in Box 405, we use the method of FIG. 11 to create primary inputs for the inputs to module mod. Advancing to Box 410, we check to see if there are any unprocessed sub-instances within the design to treat as blackbox instances, for an embodiment of our invention that supports sub-instances. If there are not, we are finished; otherwise, we go to Box 415, which sets variable mod to the module of the next blackbox instance, and list port_list to the list of output ports of the next blackbox instance. Recall that outputs of a blackbox correspond to primary inputs of the wrappers. We then use the method of FIG. 11 to create primary inputs for the outputs to the blackbox instance mod in Box 420 and return to Box 410.

Figure 11:
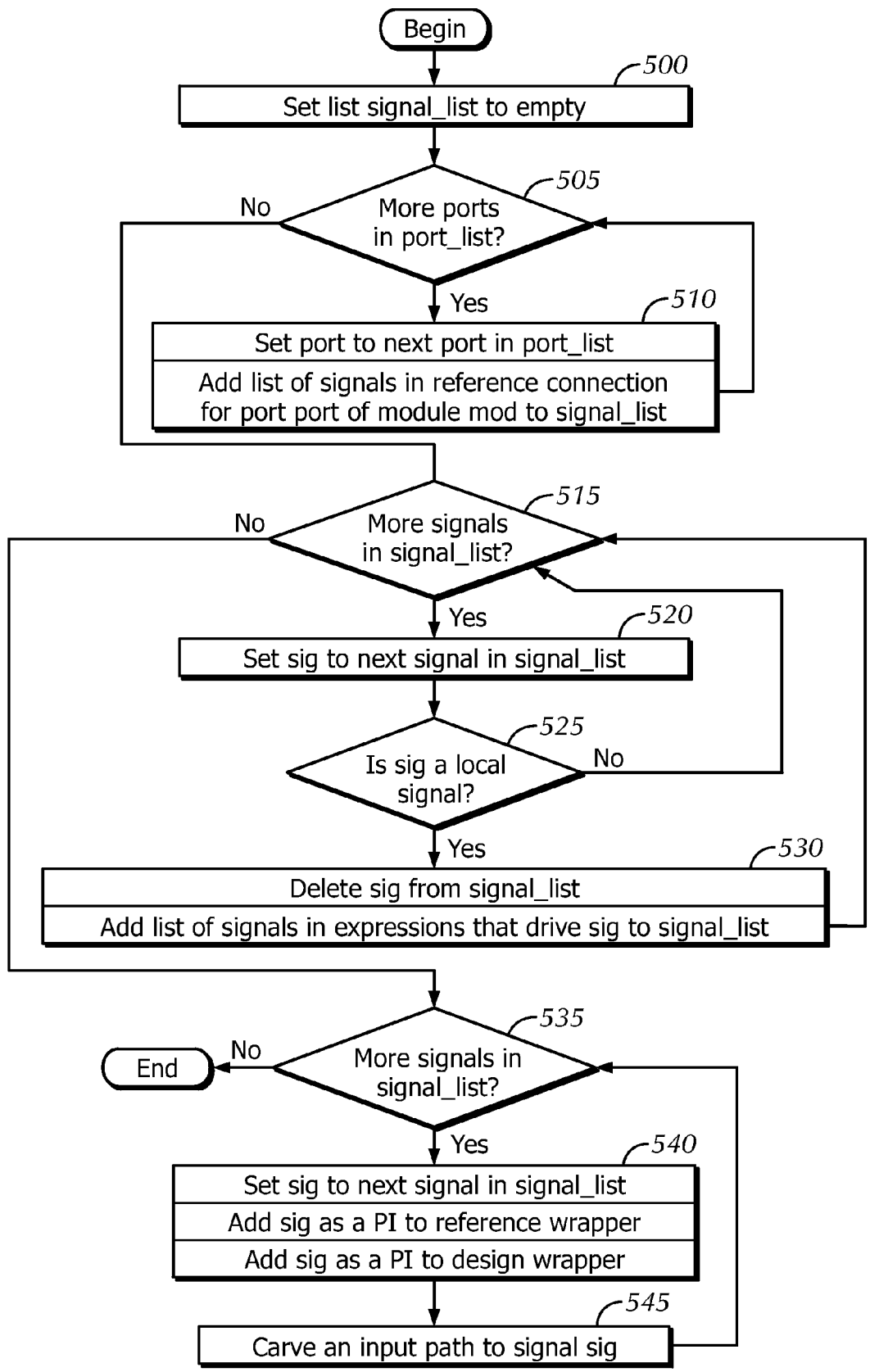
FIG. 11 illustrates the method of Box 405 and Box 420 of FIG. 10.

FIG. 11 shows the method of Box 405 and Box 420 of FIG. 10. It is assumed that the variable mod contains the name of a module and list port_list contains a list of ports on module mod, which is either the design module or, for an embodiment of this invention that supports blackboxing of sub-instances, a module representing a sub-instance thereof. The purpose of this method is to create the set of primary inputs for both the reference wrapper and the design wrapper for the set of ports in port_list on module mod. It also has the effect of defining hierarchical override files for modules in the reference model that are modified to allow driving of internal signals.

This method begins by setting the list signal_list to be an empty list in Box 500 and then proceeds to Box 505 which checks for unprocessed ports in list port_list. If there are no unprocessed ports in list port_list, control proceeds to Box 515; otherwise we go to Box 510, which sets the variable port to the next unprocessed port in list port_list, gets the reference connection for port port on module mod from the configuration records, and adds all the signals involved in the Boolean expression for the reference connection to list signal_list. We then go back to Box 505 to process any remaining ports.

Taking up from Box 515, we ask if there are any unprocessed signals in list signal_list. If not, we proceed to Box 535, where we will process the list signal_list a second time; otherwise, we go to Box 520, where we set the variable sig to the next unprocessed signal in list signal_list. Next, Box 525 asks whether signal sig is a local signal in an embodiment which allows HDL local signals as part of a reference connection. If sig is not a local signal, then we return to Box 515; otherwise we go to Box 530, which deletes signal sig from list signal_list. We then find all the expressions that are used to drive signal sig in the HDL code and add all signals used in those expressions to list signal_list before returning to Box 515.

Proceeding from Box 535, we check whether there any signals in signal_list that have not been processed a second time. If not, we are finished; otherwise, we go to Box 540. We set the variable sig to the next unprocessed element of list signal_list, add a primary input to drive sig in both the reference wrapper and the design wrapper, and then go to Box 545. Here we use the method of FIG. 12 to carve an input path to the signal whose hierarchical representation is in sig and then retrace to Box 535.

Figure 12:
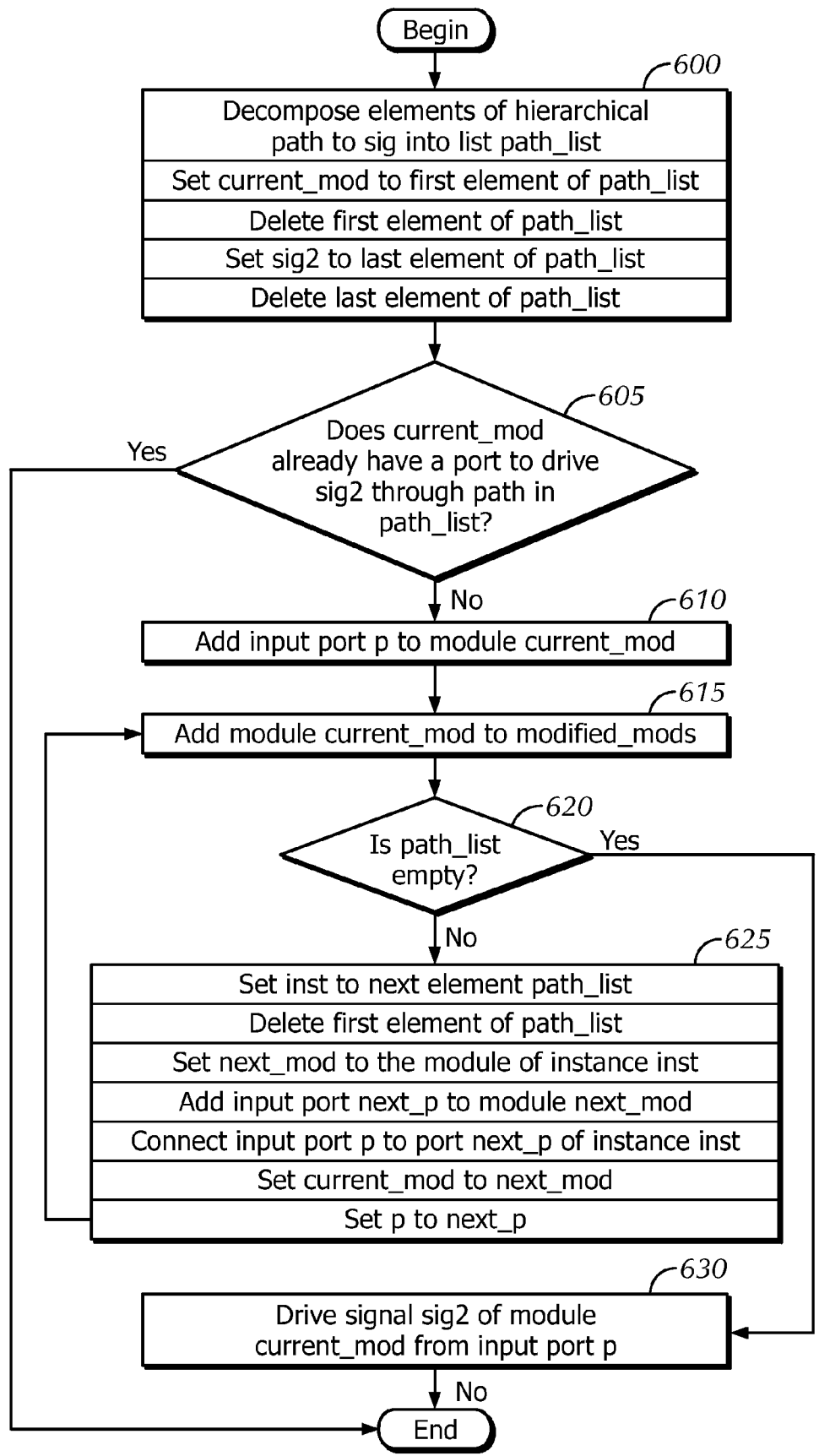
FIG. 12 illustrates the method of Box 545 of FIG. 11.

FIG. 12 illustrates the method of Box 545 of FIG. 11. It is assumed that the variable sig has been set to the hierarchical path to some signal, the first component of which is either the reference model or the design module, the last of which is a signal name, and the rest of which are instance names. The purpose of this method is to create a set of input ports on reference or design modules to drive an internal signal specified by hierarchical path sig that passes through as many levels of hierarchy as are contained in sig.

This method begins in Box 600 by taking the hierarchical path to signal sig and decomposing it into list path_list. It then places the first element of path_list into current_mod, deletes it from the list, places the last element of path_list into sig2, and deletes it from the list. Next, we proceed to Box 605, which asks if there is already a port in module current_mod to drive the signal sig2 located in a sub-instance of module current_mod whose path is contained in path_list. If there is, we are done; otherwise control proceeds to Box 610, which adds an input port p to module current_mod. This input port will eventually drive signal sig2 in the sub-instance whose path from module current_mod is contained in path_list. Advancing to Box 615, we add module current_mod to list modified_mods, and then proceed to Box 620, which asks if list path_list is empty yet. If it is, we go to Box 630; otherwise we go to Box 625, which processes the next element of path_list. To do so, it sets inst to contain the next element of path_list, which it deletes from the list. The name inst refers to an instance within module current_mod; we look up the module of which inst is an instance and put this module into next_mod. Next, we add an input port, whose name we store in next_p, to module next_mod and connect input port p to port next_p of instance inst. After setting current_mod to next_mod and p to next_p, control returns to Box 615.

Figure 13:
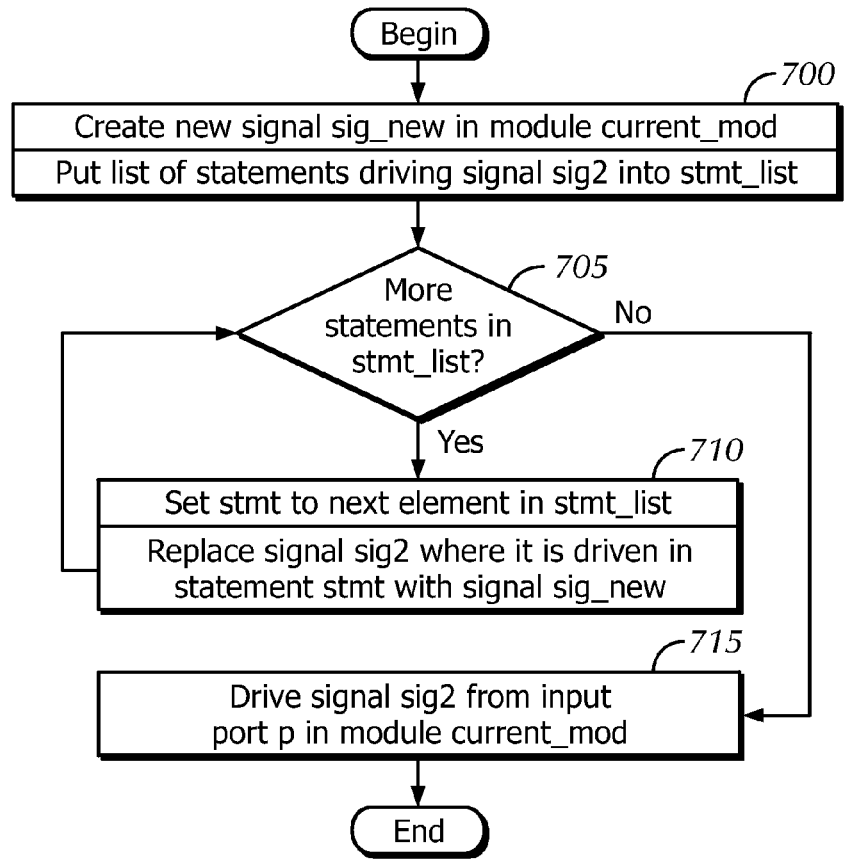
FIG. 13 illustrates the method of Box 630 of FIG. 12.

Continuing at Box 630, we drive signal sig2 of module current_mod from input port p using the method of FIG. 13 and terminate.

FIG. 13 shows the method of Box 630 of FIG. 12. It is assumed that variable current_mod contains the name of a module, p contains the name of an input port of module current_mod, and sig2 contains the name of an internal signal of module current_mod. The purpose of this method is to disconnect signal sig2 from any of the statements of module current_mod that drive it and instead to drive it from input port p. The statements that formerly drove sig2 are modified to drive a newly-created signal.

FIG. 13 starts in Box 700 by creating a new signal sig_new in module current_mod which will be driven instead of signal sig2. It then puts a list of those statements that drive signal sig2 into list stmt_list. In Box 705, we then ask if there are any unprocessed statements in list stmt_list. If not, we go to Box 715; otherwise, we go to Box 710, which sets stmt to the next unprocessed statement in list stmt_list and modifies all the places in statement stmt where signal sig2 is driven to drive signal sig_new instead. We then return to Box 705.

Continuing from Box 715, we take signal sig2, which is now not driven by any of the original logic in module current_mod, and drive it instead from input port p.

Figure 14:
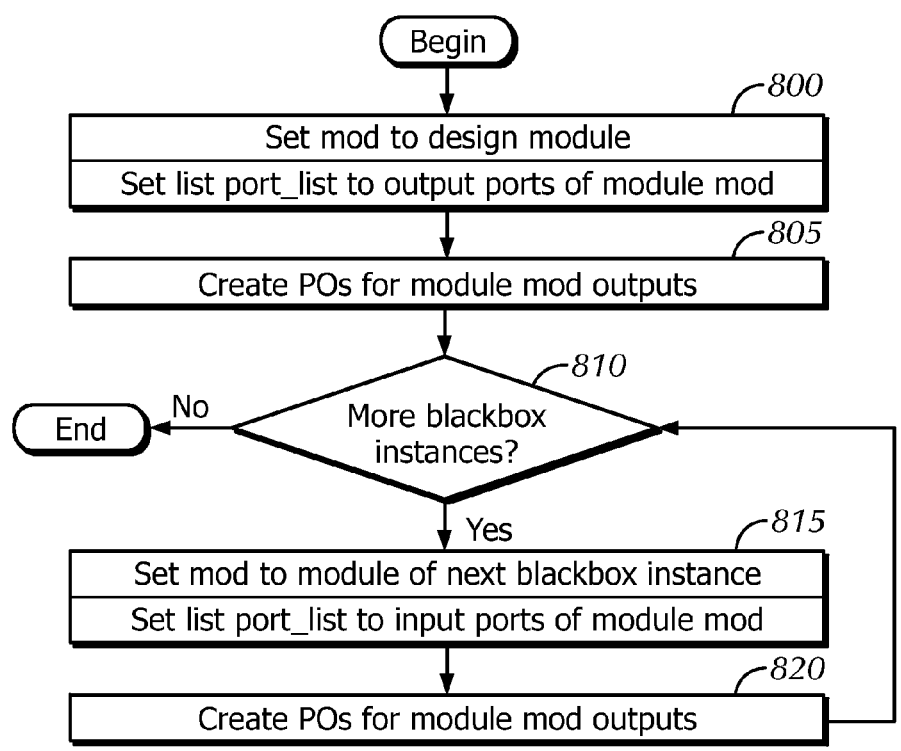
FIG. 14 illustrates the method of Box 310 of FIG. 9.

FIG. 14 shows the method of Box 310 of FIG. 9. The purpose of this method is to create all the primary outputs in the reference wrapper and the design wrapper.

This method starts in Box 800 by setting the variable mod to contain the design module and list port_list to contain the list of output ports of module mod. Next, in Box 805, we use the method of FIG. 15 to create primary outputs for the outputs of module mod. Advancing to Box 810, we check to see if there are any unprocessed sub-instances within the design to treat as blackbox instances. If there are not, we are finished; otherwise, we go to Box 815, which sets variable mod to the module of the next unprocessed blackbox instance, and list port_list to the list of input ports of the next blackbox instance. Recall that inputs of a blackbox correspond to primary outputs of the wrappers. We then use the method of FIG. 15 to create primary outputs for the inputs to the blackbox instance mod in Box 820 and return to Box 810.

Figure 15:
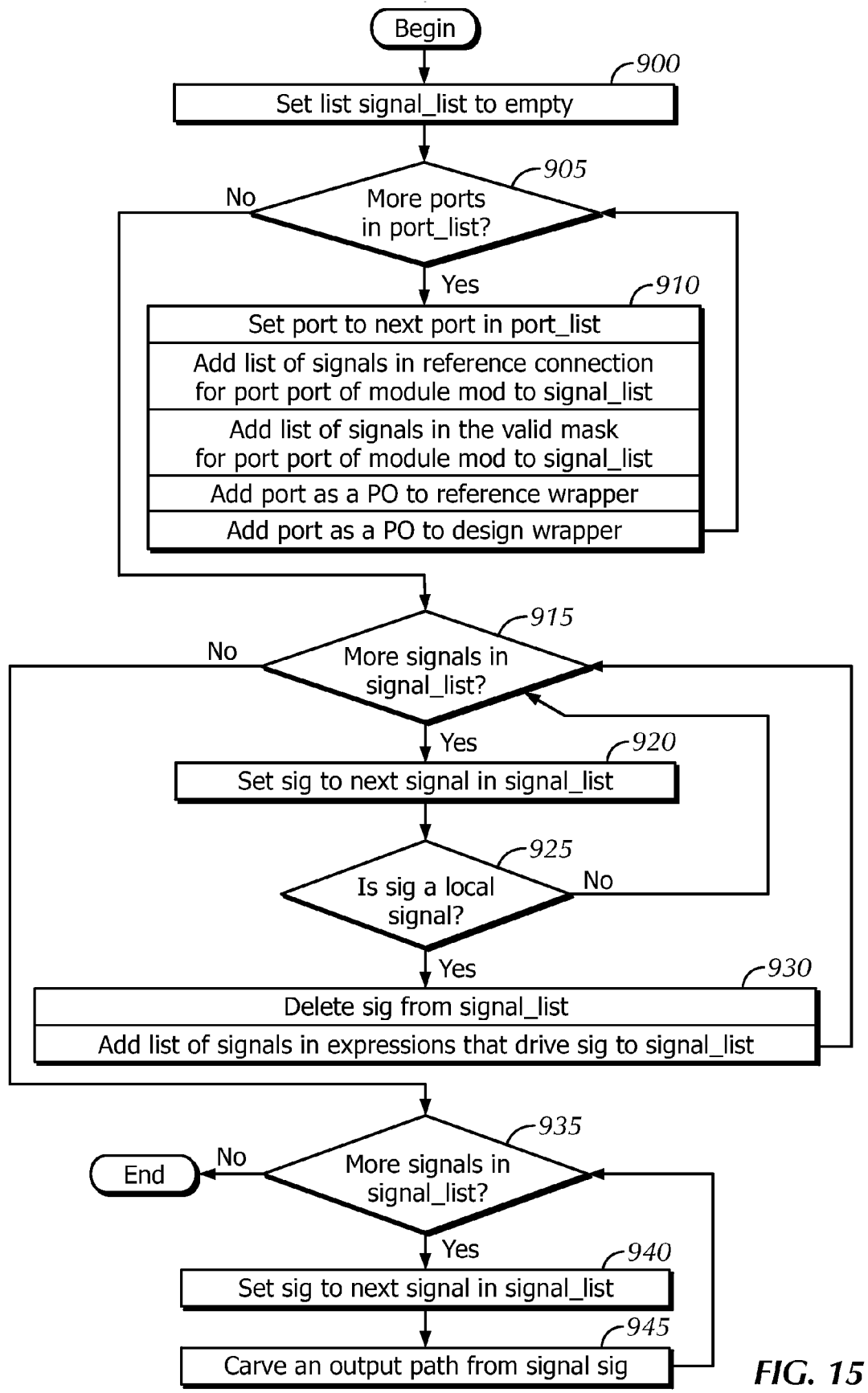
FIG. 15 illustrates the method of Box 805 and Box 820 of FIG. 14.

FIG. 15 shows the method of Box 805 and Box 820 of FIG. 14. It is assumed that the variable mod contains a module and list port_list contains a list of ports on module mod, which is either the design module or, for an embodiment of this invention that supports blackboxing of sub-instances, the module representing sub-instance thereof. The purpose of this method is to create the set of primary outputs for both the reference wrapper and the design wrapper for the set of ports in port_list on module mod. It also has the effect of defining hierarchical override files for modules in the reference model that are modified to allow access to internal signals.

This method begins by setting the list signal_list to be an empty list in Box 900 and then proceeds to Box 905 which checks for unprocessed ports in list port_list. If there are no unprocessed ports in list port_list, control proceeds to Box 915; otherwise we go to Box 910. Here, we set the variable port to the next unprocessed port in list port_list, get the reference connection in the configuration record for port port on module mod, and also add all the signals involved in the Boolean expression for the reference connection to list signal_list. For an embodiment of this invention that supports valid masks, we get the valid mask in the configuration record for port port on module mod and also add all the signals involved in it to list signal_list. We finally add port as a primary output to both the reference wrapper and the design wrapper and go back to Box 905 to process any remaining ports.

Taking up from Box 915, we ask if there are any unprocessed signals in list signal_list. If not, we proceed to Box 935, where we will process list signal_list a second time; otherwise we set the variable sig to the next unprocessed signal in Box 920. Next, Box 925 asks whether signal sig is a local signal in an embodiment which allows HDL local signals as part of a reference connection. If sig is not a local signal, then we return to Box 915; otherwise we go to Box 930, which deletes signal sig from list signal_list. We then find all the expressions that are used to drive signal sig in the HDL code and add all signals used in those expressions to list signal_list before returning to Box 915.

Proceeding from Box 935, we check whether there any signals in list signal_list that have not been processed a second time. If not, we are finished; otherwise, we go to Box 940, which sets the variable sig to the next unprocessed signal of list signal_list and then goes to Box 945. Here we use the method of FIG. 16 to carve an output path from the signal in the reference model whose hierarchical representation is in sig and then retrace to Box 935.

Figure 16:
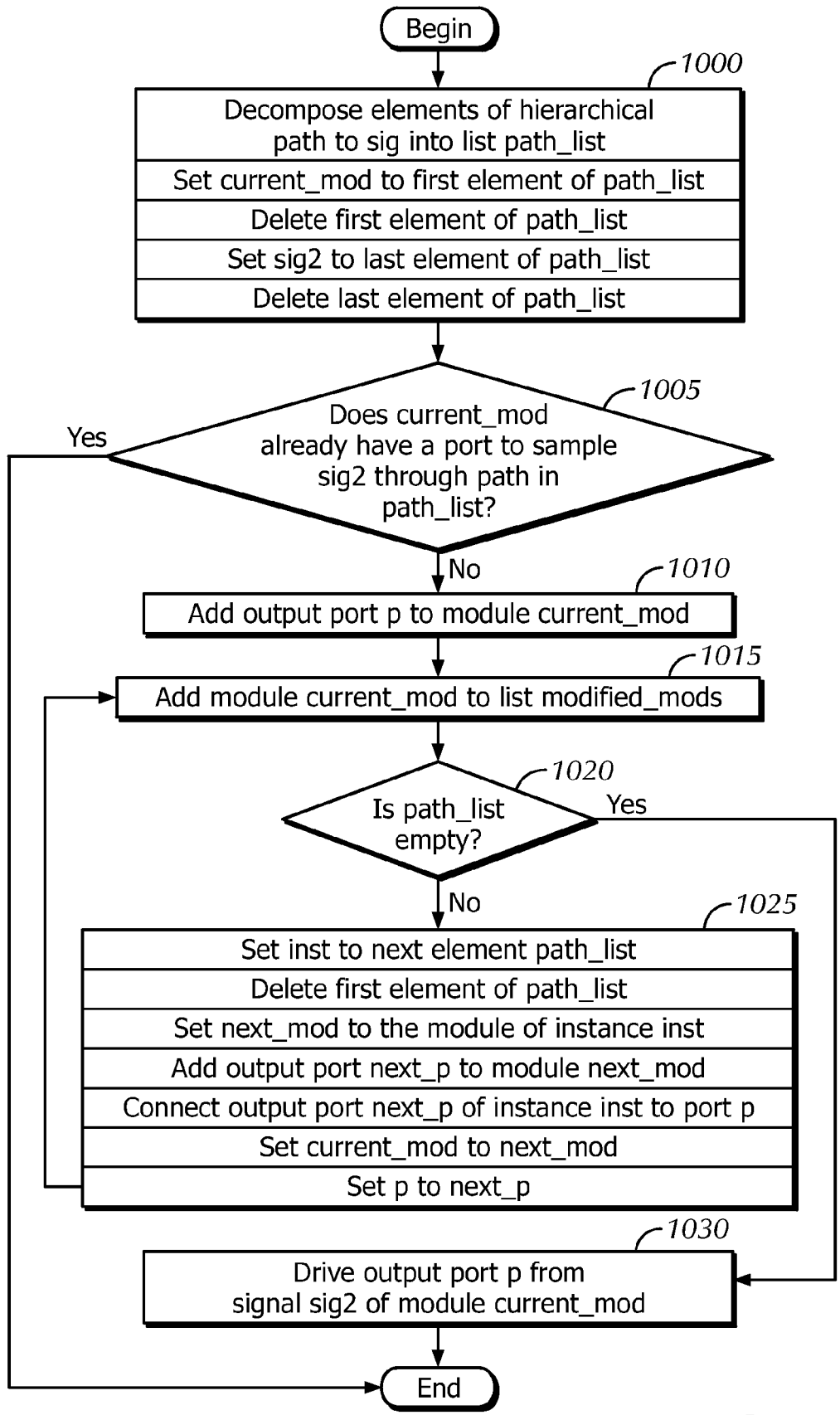
FIG. 16 illustrates the method of Box 945 of FIG. 15.

FIG. 16 illustrates the method of Box 945 of FIG. 15. It is assumed that the variable sig has been set to the hierarchical path to some signal, the first component of which is either the reference model or the design module, the last of which is a signal name, and the rest of which are instance names. The purpose of this method is create a set of output ports on reference modules to give access to an internal signal specified by hierarchical path sig that passes through as many levels of hierarchy as are contained in sig.

This method begins in Box 1000 by taking the hierarchical path to signal sig and decomposing it into list path_list. It then places the first element of path_list into current_mod, deletes it from the list, places the last element of path_list into sig2, and deletes it from the list. Next, we proceed to Box 1005, which asks if there is already a port in module current_mod to sample signal sig2 located in a sub-instance of module current_mod whose path is contained in path_list. If there is, we are done; otherwise control proceeds to Box 1010, which adds an output port p to module current_mod. This output port will eventually be driven from signal sig2 in the sub-instance whose path from module current_mod is contained in list path_list. Advancing to Box 1015, we add module current_mod to list modified_mods, and then proceed to Box 1020, which asks if list path_list is empty yet. If it is, we go to Box 1030; otherwise we go to Box 1025, which processes the next element of list path_list. To do so, it sets inst to contain the next element of list path_list, which it deletes from the list. The name inst refers to an instance within module current_mod; we look up the module of which inst is an instance and put this module into next_mod. Next, we add an output port, whose name we store in next_p, to module next_mod and connect output port next_p of instance inst to port p. After setting current_mod to next_mod and p to next_p, control returns to Box 1015.

Continuing at Box 1030, we drive output port p from signal sig2 of module current_mod and terminate.

In FIG. 17, we illustrate the method of Box 315 of FIG. 9. The purpose of this method is to compute the smallest (most negative) delay required in the configuration record for all the input ports of the design module.

Beginning in Box 1100, we initialize the variable min_delay to 0 and set list port_list to the list of input ports of the design module. Continuing to Box 1105, we ask whether there are any unprocessed ports in list port_list. If there are not, we are finished; otherwise, the method advances to Box 1110, which sets the variable port to be the next unprocessed port of list port_list and sets delay to be the value in the configuration record for the delay on input port port. Then we proceed to Box 1115 and ask whether delay is less than min_delay. If not, we return to Box 1105; otherwise we set min_delay to delay in Box 1120 and then return to Box 1105.

Figure 18:
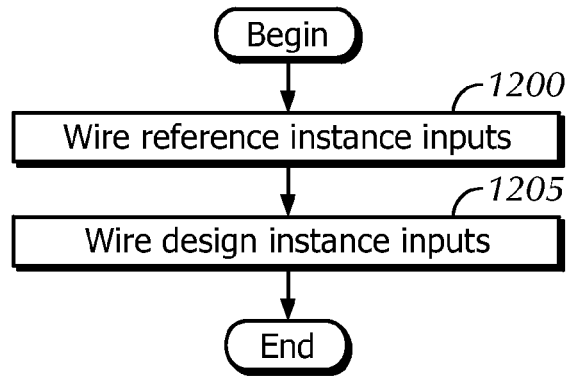
FIG. 18 illustrates the method of Box 320 of FIG. 9.

FIG. 18 shows the method of Box 320 of FIG. 9. The purpose of this method is to create all the signals needed for connecting to the inputs of the reference model within the reference wrapper and for the design module within the design wrapper.

Figure 19:
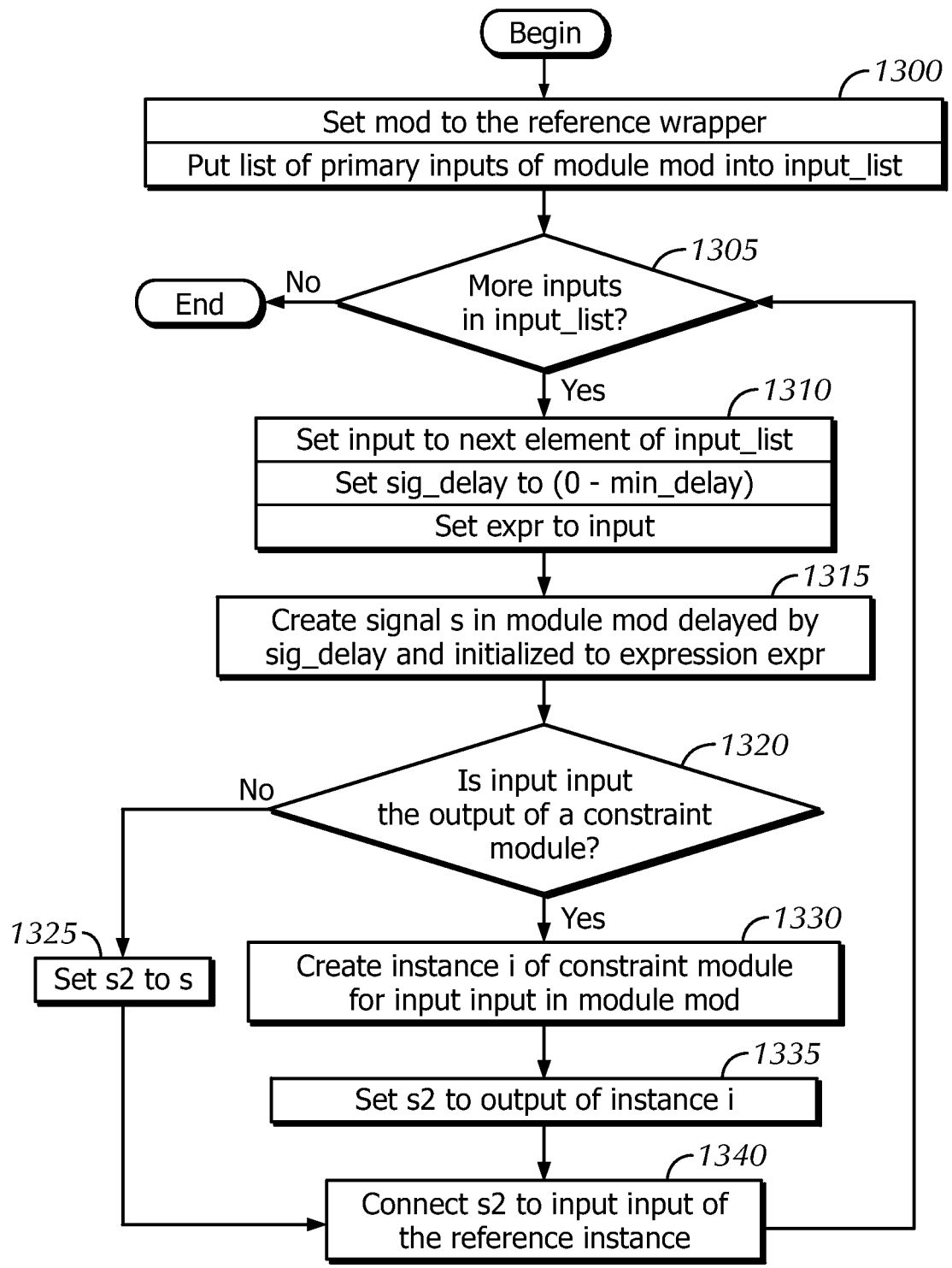
FIG. 19 illustrates the method of Box 1200 of FIG. 18.
Figure 21:
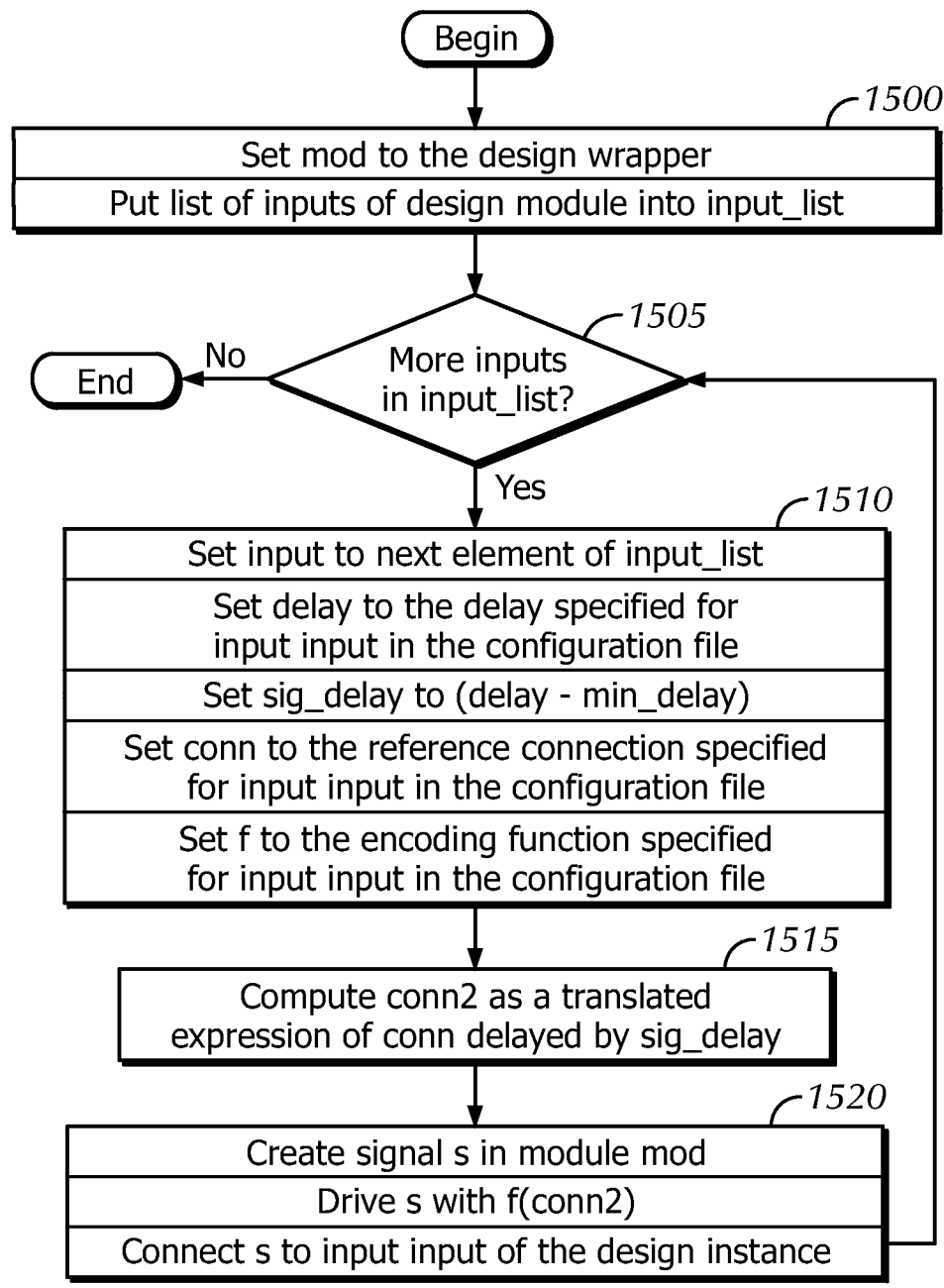
FIG. 21 illustrates the method of Box 1205 of FIG. 18.

This method starts in Box 1200, which uses the method of FIG. 19 to wire all the primary inputs of the reference wrapper to the reference model instance, proceeds to Box 1205, which uses the method of FIG. 21 to wire all the primary inputs of the design wrapper to the design module instance, and terminates.

FIG. 19 illustrates the method of Box 1200 of FIG. 18. It is assumed that min_delay contains a number that is zero or negative indicating the minimum required delay on any design module input. The purpose of this method is to create all the signals needed for driving the input ports of the instance of the reference model within the reference wrapper.

This method starts in Box 1300 by setting mod to the reference wrapper and putting its list of primary inputs computed using the method of FIG. 10 into list input_list. It then goes to Box 1305, which asks whether there are any unprocessed inputs in list input_list. If not, we are finished; otherwise control advances to Box 1310. We then set variable input to the next unprocessed input of list input_list, set sig_delay to the negative of min_delay by subtracting sig_delay from 0, and expr to input input. We then go to Box 1315 which uses the method of FIG. 20 to create in module mod a signal s which is the expression expr delayed by sig_delay clocks. Next, we go to Box 1320 and ask, in an embodiment of this invention that allows reference inputs to be constrained using a constraint module, whether input input of module mod should be the output of such a constraint module. If not, we set s2 to s in Box 1325 and progress to Box 1340; otherwise we go to Box 1330 which creates an instance i of the constraint module whose output produces the constrained version of input input and advance to Box 1335. Here, we set s2 to the constrained output of instance i. Finally, regardless of which branch we took from Box 1320, we arrive at Box 1340, where we connect s2 to input input of the instance of the reference model, where it may descend through several layers of hierarchy to drive an internal signal. We return to Box 1305.

Figure 20:
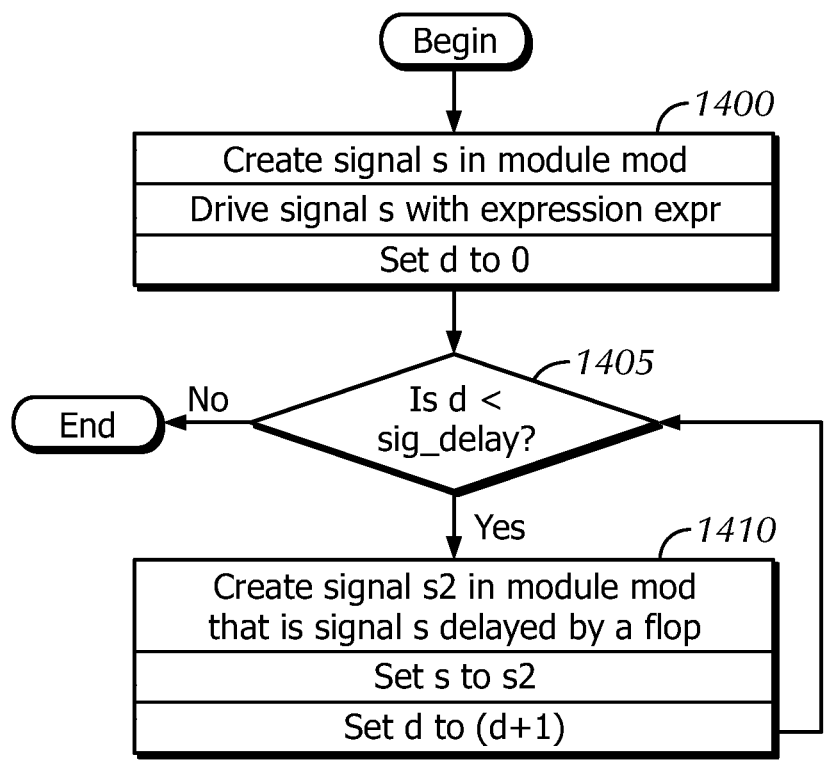
FIG. 20 illustrates the method of Box 1315 of FIG. 19, Box 1815 of FIG. 24, Box 2245 of FIG. 28, and Box 2325 of FIG. 29.
Figure 24:
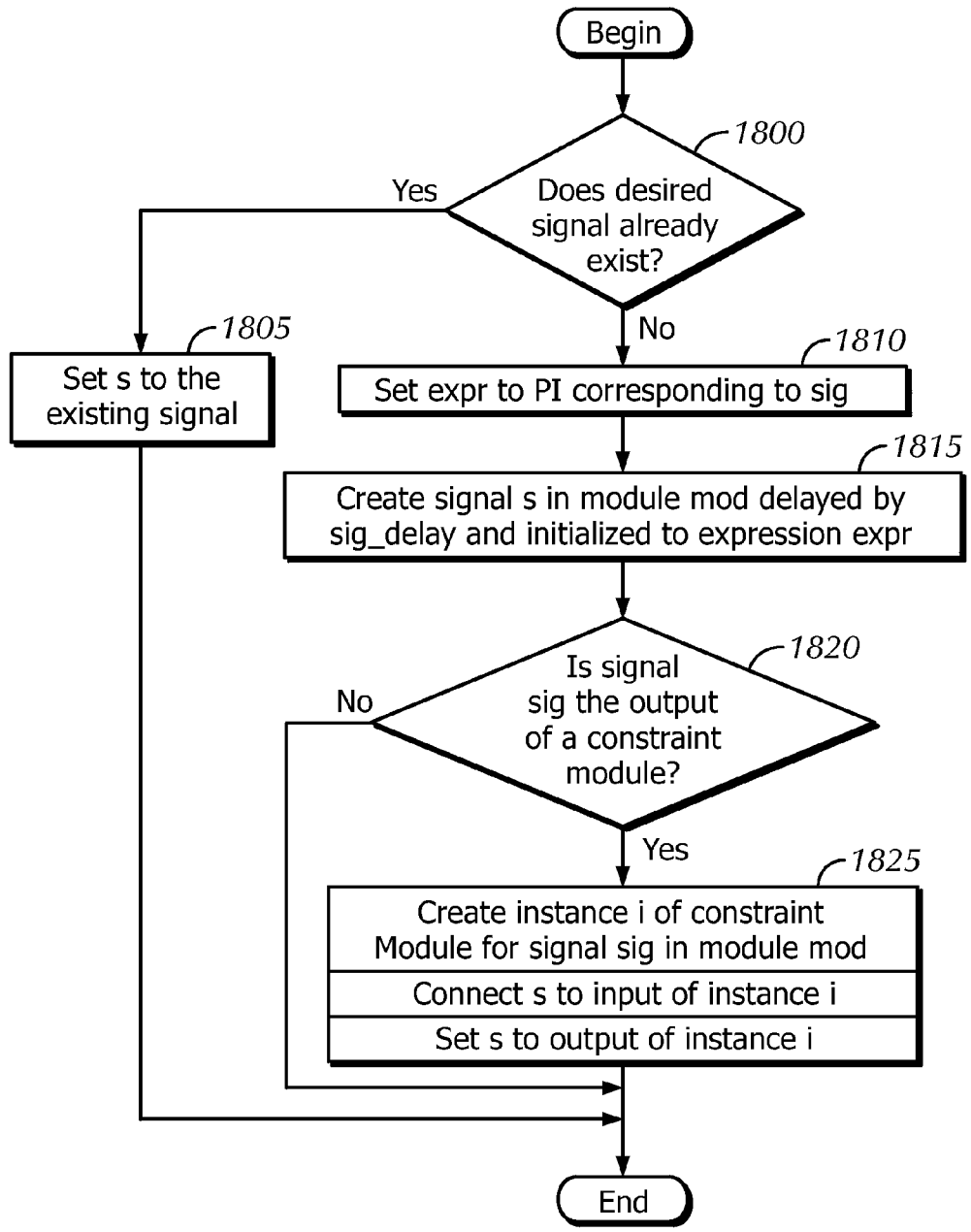
FIG. 24 illustrates the method of Box 1635 of FIG. 22.
Figure 28:
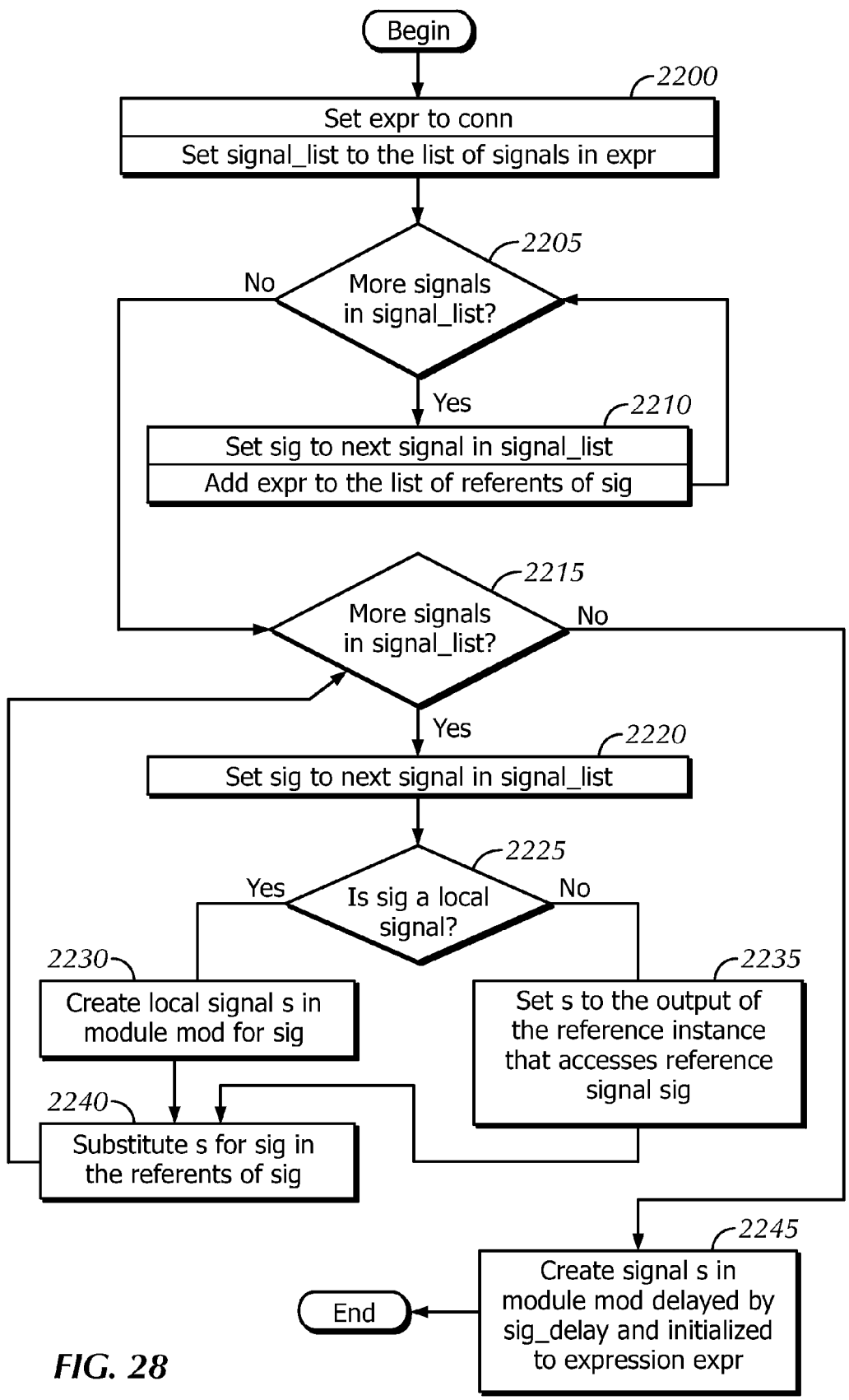
FIG. 28 illustrates the method of Box 2125 and Box 2145 of FIG. 27.
Figure 29:
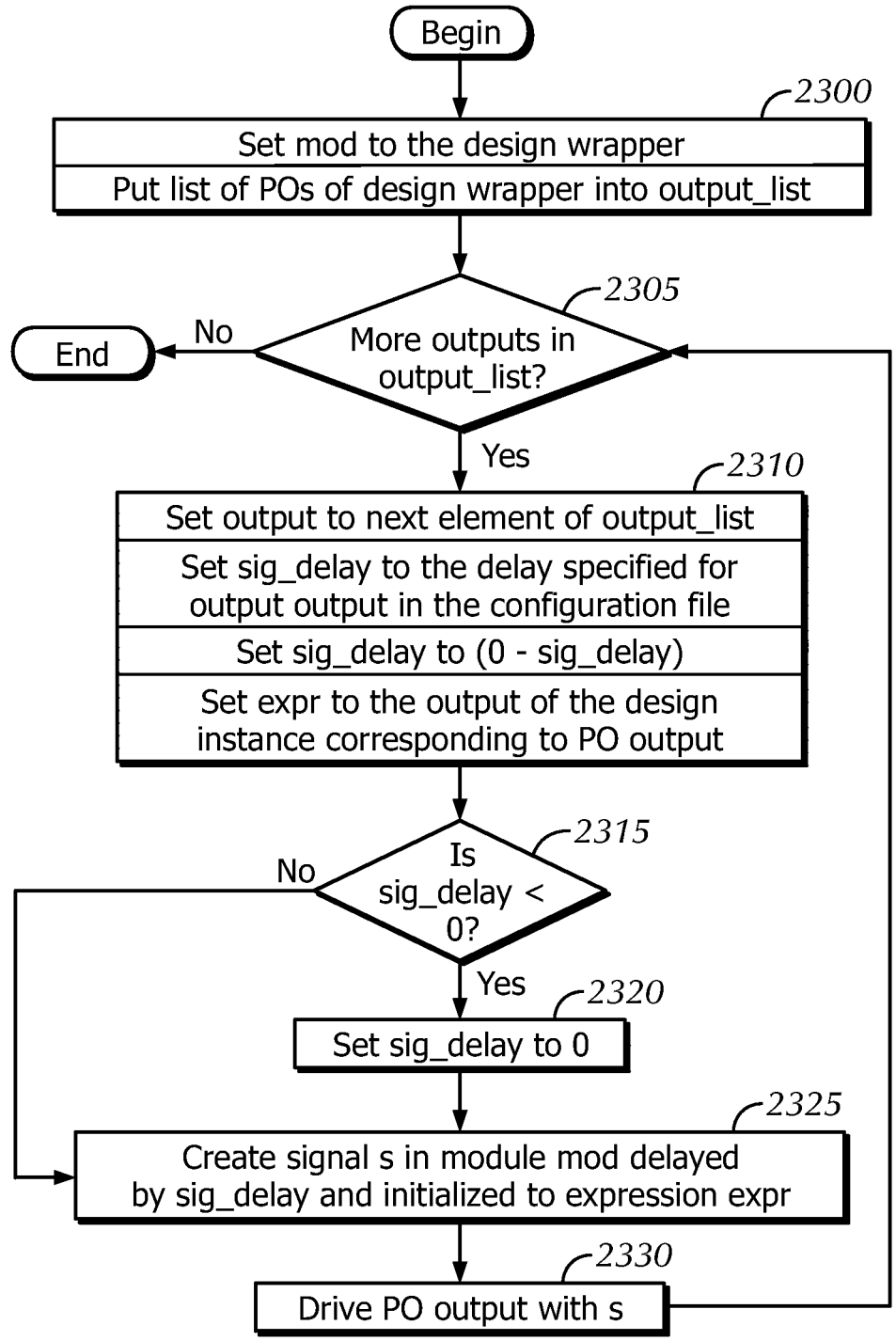
FIG. 29 illustrates the method of Box 2005 of FIG. 26.

FIG. 20 shows the method of Box 1315 of FIG. 19, Box 1815 of FIG. 24, Box 2245 of FIG. 28, and Box 2325 of FIG. 29. It assumes that the variable expr has been set to an expression whose value is to be delayed by a non-negative number of clocks contained in sig_delay within module mod. The purpose of this method is to create a signal s which is the value of expr delayed by sig_delay clock cycles.

It begins in Box 1400, which creates a signal s within module mod driven by expression expr and sets d to 0. Then we ask in Box 1405 whether d is less than the desired signal delay sig_delay. If not, we are finished; otherwise, we go to Box 1410, where we create a signal s2 in module mod that is signal s delayed by a flop, set the variable s to s2, increment d by 1, and return to Box 1405.

FIG. 21 illustrates the method of Box 1205 of FIG. 18. It is assumed that min_delay contains a number that is zero or negative indicating the minimum required delay on any design module input. The purpose of this method is to create all the signals needed for driving the input ports of the instance of the design module within the design wrapper.

It starts in Box 1500, which sets variable mod to the design wrapper and puts the list of design module inputs into list input_list. We then proceed to Box 1505 where we ask if there are any more unprocessed inputs in input_list. If there are not, we are done; otherwise, we advance to Box 1510. Here, we set variable input to the next unprocessed input of list input_list, set delay to the delay value specified in the configuration record for input input, set sig_delay to the difference between delay and min_delay, set conn to the reference connection specified in the configuration record for input input, and set f to the encoding function specified in the configuration record for input input. If there is no encoding function, f should be taken as the identity function. Next, we go to Box 1515 to compute conn2 as a translated expression of conn with a delay of sig_delay using the method of FIG. 22. Finally, in Box 1520, we create a signal s within module mod, drive it with f(conn2), and connect s to input input of the design instance before returning to Box 1505.

Figure 22:
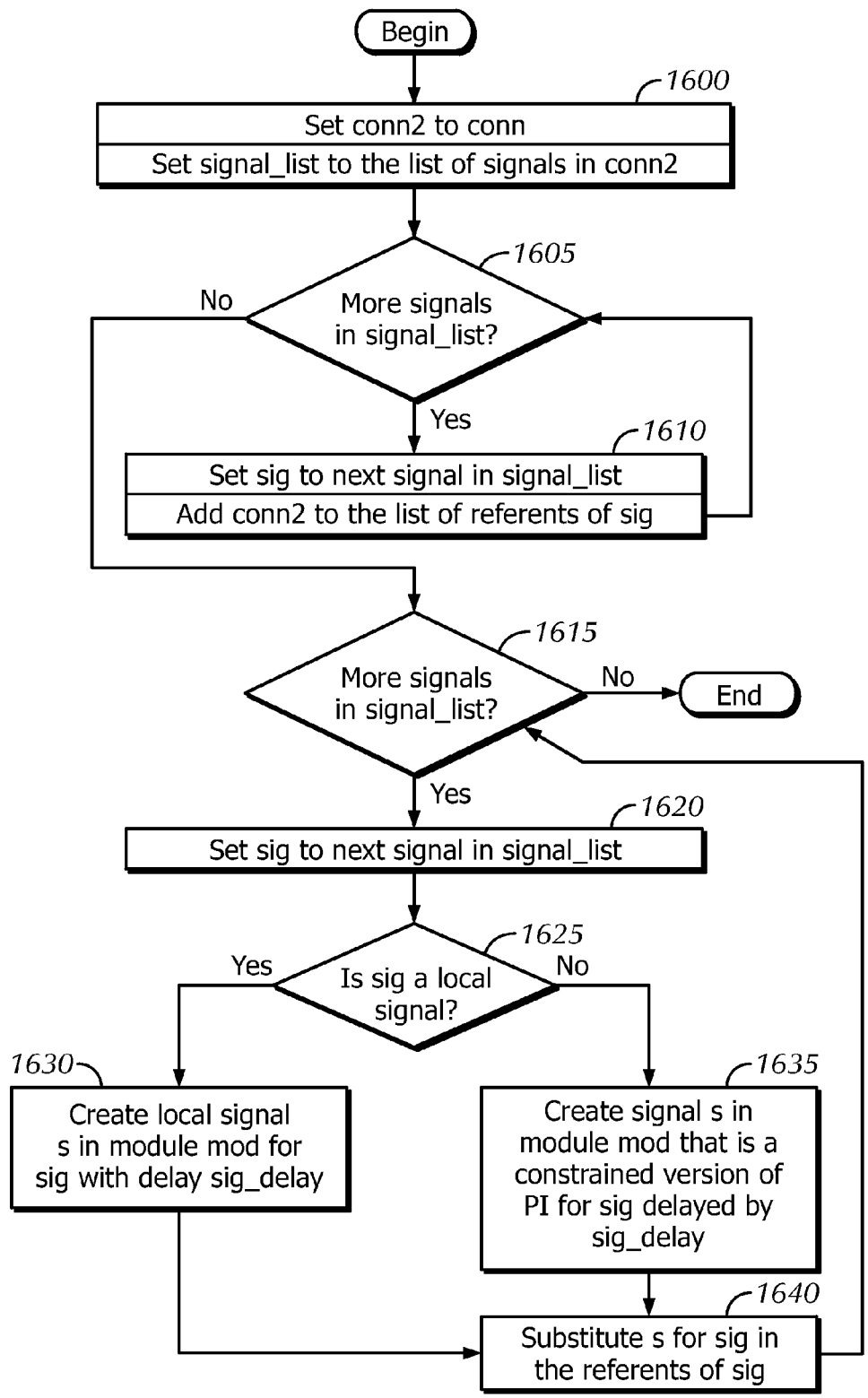
FIG. 22 illustrates the method of Box 1515 of FIG. 21.

FIG. 22 illustrates the method of Box 1515 of FIG. 21. It is assumed that conn contains the reference connection from the configuration records for some input port of the design module and that sig_delay contains a non-negative number indicating the required delay of a signal relative to the primary inputs of the design wrapper. The purpose of this method is to create a signal that evaluates the reference connection associated with some input port of the design module using primary inputs for any reference signals specified in said reference connection.

This method starts in Box 1600, which sets variable conn2 to conn and sets list signal_list to the list of signals contained in the expression conn2. We then advance to Box 1605, which asks whether there are any unprocessed signals in list signal_list. If there are not, control goes to Box 1615, which is used to process list signal_list a second time; otherwise control goes to Box 1610. Here, we set sig to the next unprocessed signal in list signal_list and mark conn2 as the referent of signal sig before returning to Box 1605.

Continuing from Box 1615, we ask if there are any unprocessed signals in a second processing of list signal_list. If there are not, we are done; otherwise, we progress to Box 1620, which sets sig to the next unprocessed signal in list signal_list and continue to Box 1625, which asks whether sig represents a local signal in an embodiment of this invention that supports local signals. If it is, we progress to Box 1630, which uses the method of FIG. 23 to create a local signal s in the design wrapper mod for sig having a delay of sig_delay; otherwise, we progress to Box 1635, which uses the method of FIG. 24 to create a signal s in the design wrapper mod that is a delayed, possibly constrained version of the primary input to the design wrapper representing reference signal sig. In either case, we next arrive at Box 1640, which uses the method of FIG. 25 to substitute s for sig in each of the statements that are referents of sig, and return to Box 1615.

Figure 23:
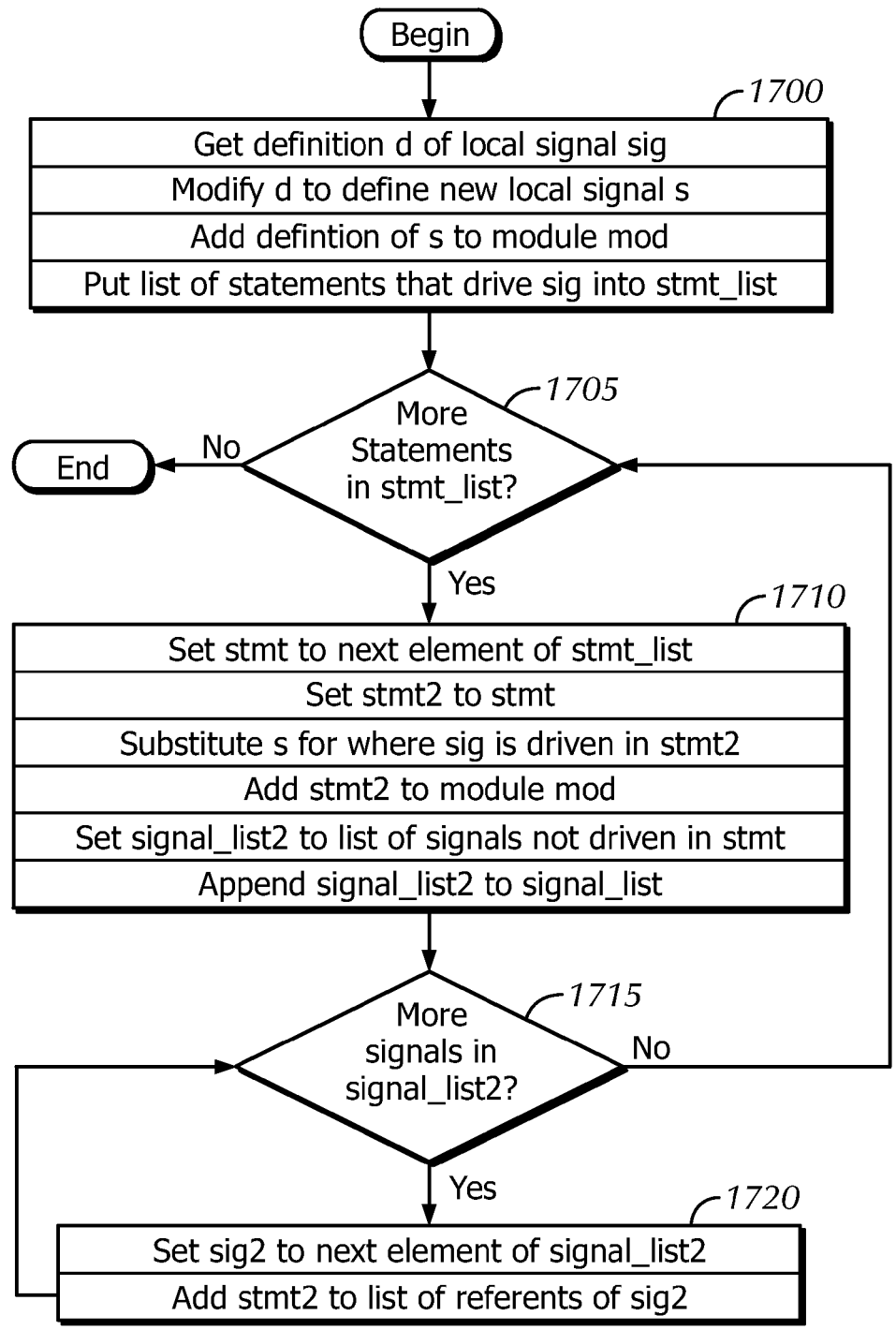
FIG. 23 illustrates the method of Box 1630 of FIG. 22 and Box 2230 of FIG. 28.

FIG. 23 illustrates method of Box 1630 of FIG. 22 and Box 2230 of FIG. 28. It is assumed that the variable sig contains the name of a local wire for an embodiment of our invention that supports local wires in reference connections and that mod refers to either the reference wrapper or the design wrapper. The purpose of this method is to create in module mod the necessary definitions to support the local wire described by sig.

Control starts in Box 1700, in which we get the definition d from the configuration record for local signal sig, modify it to define a new local signal s that will hold the value of sig after being delayed by sig_delay cycles with possibly constrained versions of the primary inputs of the design wrapper, add the definition of s to design wrapper mod, and put into list stmt_list the list of statements from the configuration record for signal sig that drive it. Proceeding to Box 1705, we ask if there are more unprocessed statements in list stmt_list. If not, we are finished; otherwise we continue to Box 1710. Here, we set stmt to the next unprocessed statement in list stmt_list and initialize stmt2 to be the same as stmt. We then substitute our newly-created signal s for the places where sig is driven in stmt2 and add stmt2 to design wrapper mod. Finally, we set list signal_list2 to the list of signals of stmt which are not driven in stmt and append signal_list2 to the list signal_list before going to Box 1715, which asks if there are any unprocessed signals in signal_list2. If there are not, we return to Box 1705; otherwise we proceed to Box 1720, which sets sig2 to the next unprocessed signal in list signal_list2, adds stmt2 to the list of referents to signal sig2 and returns to Box 1715.

FIG. 24 illustrates the method of Box 1635 of FIG. 22. It is assumed that mod refers to the design wrapper, sig contains the name of a reference signal that is represented by a primary input of module mod, and sig_delay contains a non-negative number determining how many clock cycles to delay the primary input to produce signal s. The purpose of this method is to create in module mod a signal s that is a possibly constrained version of a primary input representing internal signal sig of the reference model delayed by sig_delay clock cycles.

It starts in Box 1800 by asking if there is already a possibly constrained signal delayed by sig_delay clock cycles for the primary input representing sig within module mod. If so, we go to Box 1805, which sets s to said existing signal and finishes; otherwise we proceed to Box 1810 which sets expr to the primary input of module mod corresponding to signal reference sig. Control then advances to Box 1815, which uses the method of FIG. 20 to create a signal s in module mod that is delayed by sig_delay clocks and initialized to expression expr. We then proceed to Box 1820, which asks if the reference signal sig should be the output of a constraint module for an embodiment of this invention which supports constraint modules. If not, we are done; otherwise, we continue to Box 1825 which creates in module mod an instance i of said constraint module for signal sig, connects s to the input of instance i, and then sets s to the output of instance i representing the constrained version of sig before finishing.

Figure 25:
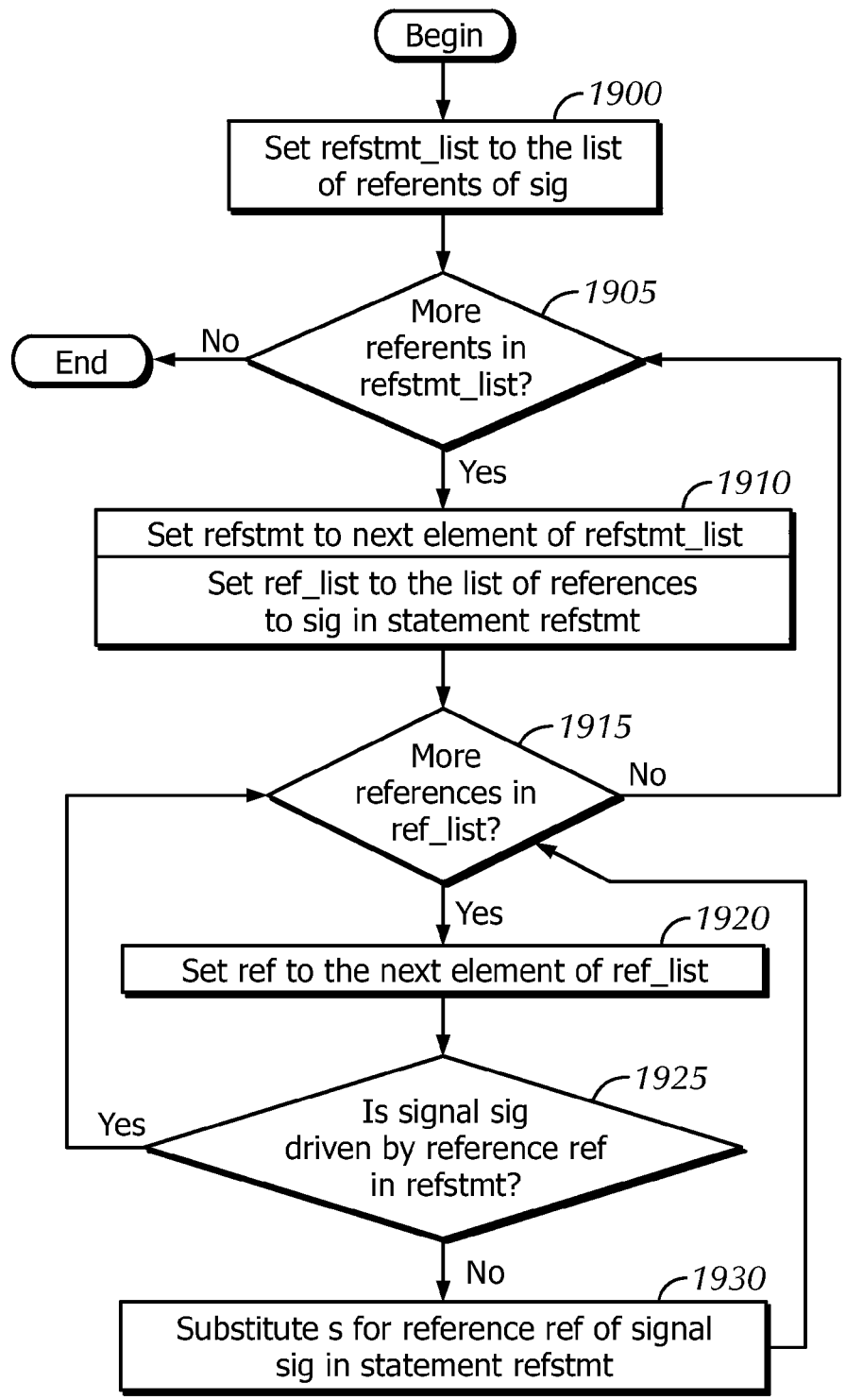
FIG. 25 illustrates the method of Box 1640 of FIG. 22 and Box 2240 of FIG. 28.

FIG. 25 illustrates the method of Box 1640 of FIG. 22 and Box 2240 of FIG. 28. It assumes that s and sig are signal names. The purpose of this method is to substitute signal s for non-driving references to signal sig in all the statements that are referents of sig.

The method starts in Box 1900, which sets list refstmt_list to the list of statements that were marked as referents of signal sig. It then progresses to Box 1905, which asks if there are more unprocessed referents to signal sig in list refstmt_list. If not, we are done; otherwise, we go to Box 1910, which sets refstmt to the next unprocessed referent in list refstmt_list and sets ref_list to the list of references to signal sig within statement refstmt. Next, Box 1915 asks if there are more unprocessed references in list ref_list. If there are not, control returns to Box 1905; otherwise, we advance to Box 1920, which sets ref to the next unprocessed reference in list ref_list. Then we progress to Box 1925, which asks whether signal sig is driven by reference ref in statement refstmt. For example, signal sig may appear on both sides of an assignment statement or at both an input and output terminal of an instance. If the signal is driven by this reference, control returns to Box 1915; otherwise, in Box 1930 we substitute s for reference ref of signal sig in statement refstmt before returning to Box 1915.

Figure 26:
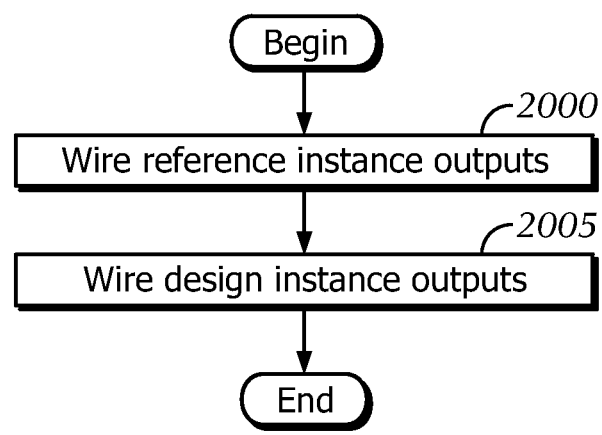
FIG. 26 illustrates the method of Box 325 of FIG. 9.

FIG. 26 illustrates the method of Box 325 of FIG. 9. The purpose of this method is to create all the signals needed for driving the primary outputs of the reference wrapper and the design wrapper.

Figure 27:
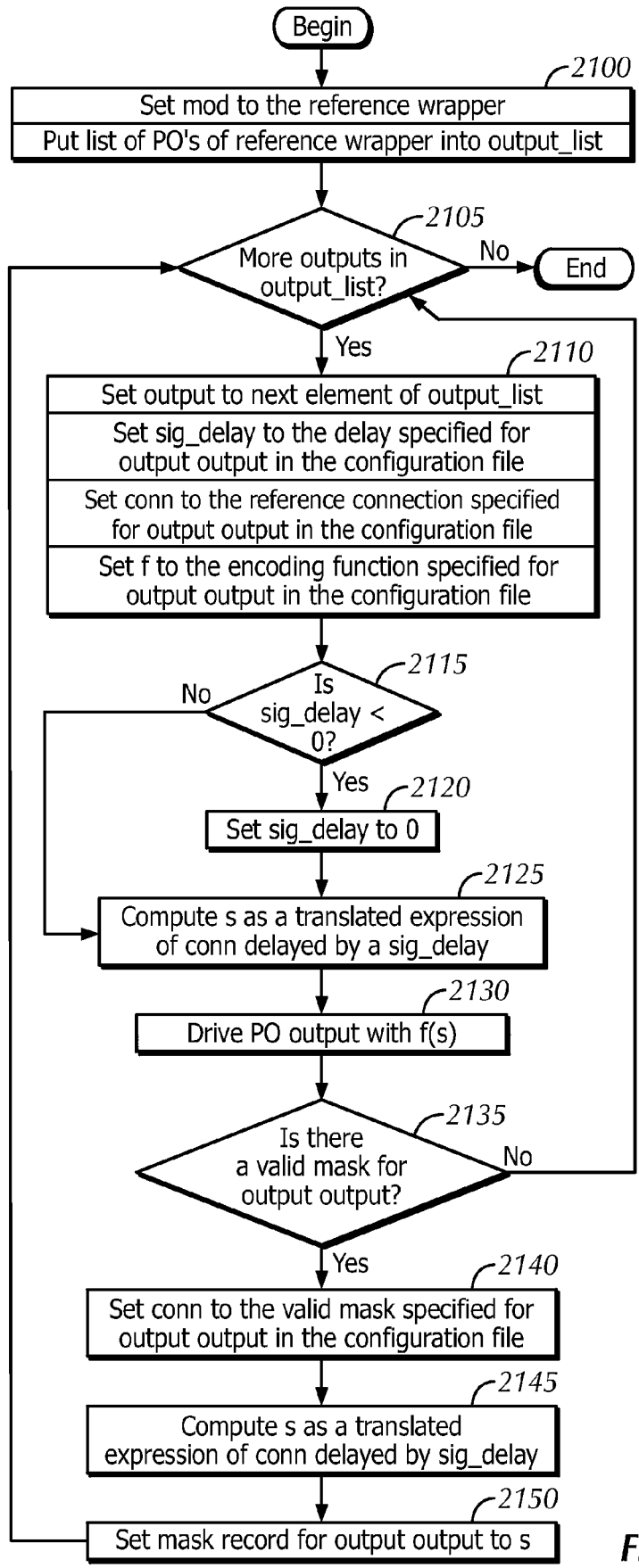
FIG. 27 illustrates the method of Box 2000 of FIG. 26.

It starts in Box 2000, which uses the method of FIG. 27 to wire the outputs of the reference instance to the reference wrapper's primary outputs. It then goes to Box 2005, which uses the method of FIG. 29 to wire the outputs of the design instance to the design wrapper's primary outputs, and finishes.

FIG. 27 illustrates the method of Box 2000 of FIG. 26. The purpose of this method is to create the signals needed to drive the primary outputs of the reference wrapper. Each primary output corresponds to an output port of the design module, which must be built in the reference wrapper according to the reference connection specified for said output port using output ports of the hierarchical override file for the reference model.

It begins in Box 2100, which sets mod to be the reference wrapper and puts the list of primary outputs of the reference wrapper mod into list output_list. Continuing to Box 2105, we ask if there are more unprocessed outputs in list output_list. If there are not, we are done; otherwise, we go to Box 2110, where we set output to the next unprocessed output in list output_list. Recalling that the primary outputs of the wrappers correspond to outputs of the design module, we can query the configuration record for information that is relevant to primary output output. Accordingly, we set sig_delay, conn, and f to the delay, reference connection, and, the encoding function specified in the configuration record for output output of module mod, respectively. If there is no encoding function, f should be taken as the identity function. We then advance to Box 2115, which asks if the variable sig_delay is less than 0. If it is not, we proceed to Box 2125; otherwise we set sig_delay to 0 in Box 2120 before proceeding to Box 2125. Next, we use the method of FIG. 28 to compute s as a translated version of conn delayed by sig_delay clock cycles. Continuing in Box 2130, we drive the primary output output with f(s) and advance to Box 2135, which asks whether the configuration record for output output of module mod specifies a valid mask for an embodiment of this invention that allows a valid mask to be specified. If it does not, we return to Box 2105; otherwise we go to Box 2140, which sets conn to the expression for the valid mask specified in the configuration record for output output of module mod. Then, we advance to Box 2145 which uses the method of FIG. 28 to compute s as a translated version of conn delayed by sig_delay clock cycles. Finally, in Box 2150, we record s as the mask signal in the mask record for output output and return to Box 2105.

FIG. 28 illustrates the method of Box 2125 and Box 2145 of FIG. 27. It is assumed that conn is set to the reference connection for the output whose translated expression is to be computed, that sig_delay is the number of clocks by which the translated expression needs to be delayed, and that mod is set to the reference wrapper. The purpose of this method is to create the signals needed to drive a particular primary output of the reference wrapper. This primary output corresponds to an output port of the design module, which must be built in the reference wrapper according to the reference connection specified in the configuration record for said output port using output ports of the hierarchical override file for the reference model and delayed by the number of clocks specified in its configuration record.

This method starts in Box 2200, which sets expr to conn and sets list signal_list to the list of signals in expr. It then continues to Box 2205, which asks whether there are any unprocessed signals in list signal_list. If not, control transfers to Box 2215, which will process list signal_list a second time; otherwise, we go to Box 2210, which sets sig to the next unprocessed signal in list signal_list and adds expr to the list of referents of signal sig before returning to Box 2205. In Box 2215, we ask if there are any signals in list signal_list that have not been processed a second time. If there are not, we proceed to Box 2245 which uses the method of FIG. 20 to create a signal s in the reference wrapper mod that is initialized to expr delayed by sig_delay clock cycles, and exit; otherwise, we go to Box 2220, where we set sig to the next unprocessed signal in list signal_list. We advance hence to Box 2225, which asks whether signal sig represents a local wire in an embodiment of this invention that supports local wires. If it does, we go to Box 2230 and use the method of FIG. 23 to create a local signal s in module mod to contain the value of signal sig before proceeding to Box 2240; otherwise, we go to Box 2235. We know that sig refers to an internal signal within the reference model. Recall that in Box 945 of FIG. 15 we created a new output of the reference instance to access sig. We set s to said output of the reference instance and proceed to Box 2240. Here, we use the method of FIG. 25 to substitute s for sig in the referents of signal sig and then return to Box 2215.

FIG. 29 illustrates the method of Box 2005 of FIG. 26. The purpose of this method is to create the signals needed to drive the primary outputs of the design wrapper. Each primary output corresponds to an output port of the design module, which needs to be delayed if the delay specified for the port in the configuration record is negative in an embodiment of this invention that supports delays.

It starts in Box 2300 by setting mod to be the design wrapper and putting the list of primary outputs of the design wrapper into list output_list. It then progresses to Box 2305, which asks if there are any unprocessed outputs in list output_list. If not, we are done; otherwise we go to Box 2310, which sets output to the next unprocessed output of list output_list. Recall that outputs of the design wrapper correspond to outputs of the design instance, which have definitions in its configuration record. Accordingly, we set sig_delay to the delay specified in the configuration record for this output. We then negate this quantity by setting sig_delay to (zero minus sig_delay). We do this operation because negative delays on outputs relative to the reference model are implemented as positive delays in the design wrapper. We also set expr to be the output of the design instance corresponding to primary output output and proceed to Box 2315, which asks if sig_delay is less than 0. If it is not, we advance to Box 2325; otherwise, we set sig_delay to 0 in Box 2320 prior to going to Box 2325. In either case, we then use the method of FIG. 20 to create a signal s in the design wrapper mod which is initialized to the design instance output expr and delayed by sig_delay clocks. Finally, we drive the primary output output with s in Box 2330 before returning to Box 2305.

Figure 30:
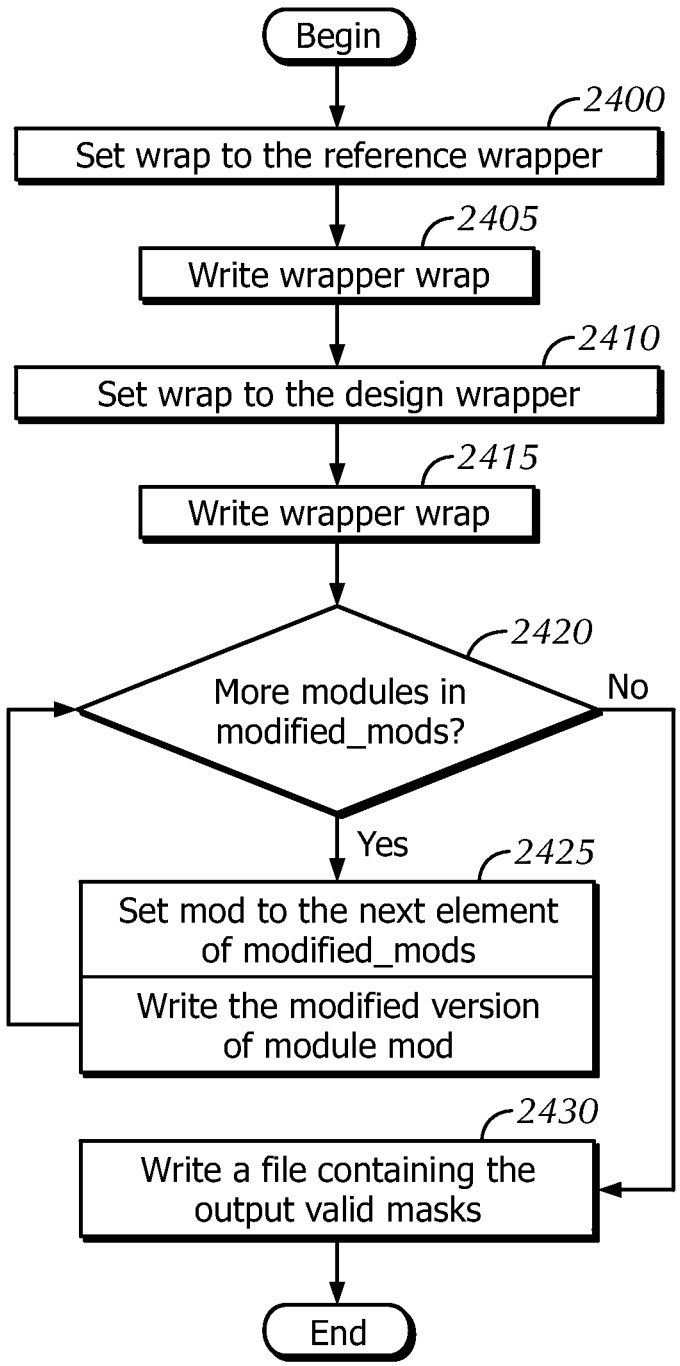
FIG. 30 illustrates the method of Box 110 of FIG. 7.

FIG. 30 illustrates the method of Box 110 of FIG. 7. It assumes that the list modified_mods contains a list of reference modules that have been modified to drive or access internal signals in the reference model. The purpose of this method is to write all of the output files needed for running sequential equivalence checking.

Figure 31:
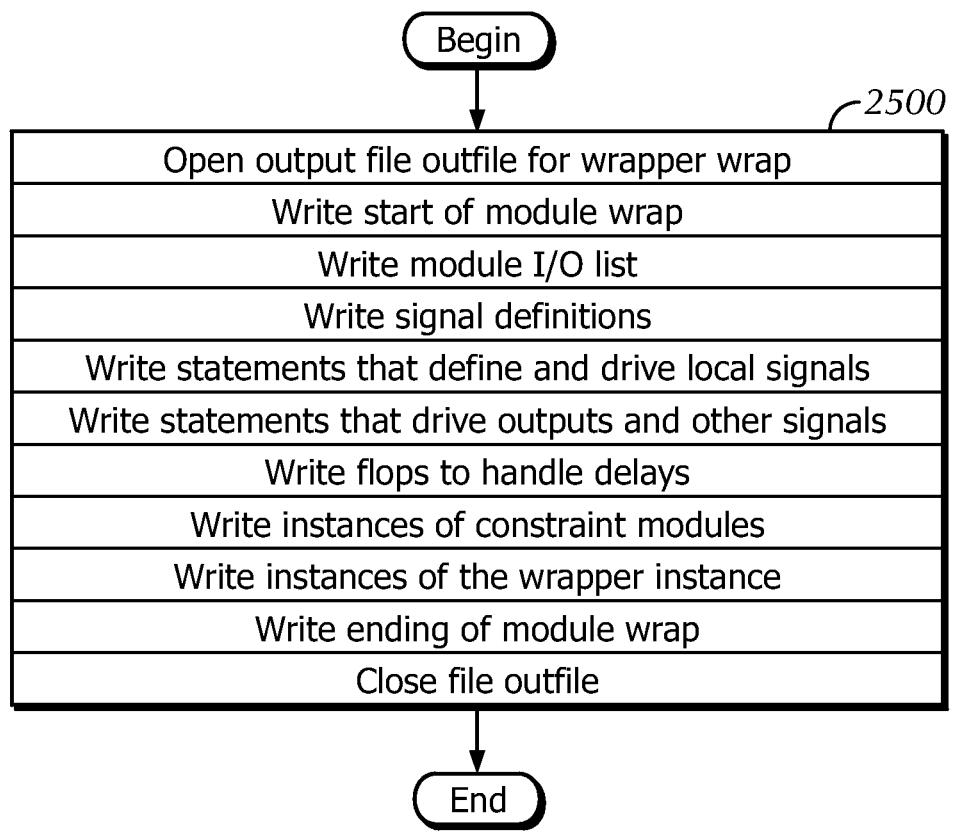
FIG. 31 illustrates the method of Box 2405 and Box 2415 of FIG. 30.

It starts in Box 2400 by setting variable wrap to the reference wrapper and then advances to Box 2405 to write reference wrapper wrap using the method of FIG. 31. Next, it sets wrap to the design wrapper in Box 2410 and goes to Box 2415 to write design wrapper wrap using the method of FIG. 31. It then proceeds to Box 2420, which asks if there are any unprocessed modules in list modified_mods. If there are not, we go to Box 2430, which uses the method of FIG. 32 to write a file containing the output valid masks, for an embodiment of this invention that supports output valid masks, and finish; otherwise, we go to Box 2425. Here, we set mod to the next unprocessed module in list modified_mods and write the modified version of module mod before returning to Box 2420.

FIG. 31 illustrates the method of Box 2405 and Box 2415 of FIG. 30. It is assumed that wrap is set to the wrapper to be written. The purpose of this method is to write into a file the information that has been computed for either the reference wrapper or the design wrapper.

All the work in this method is done in Box 2500, which opens an output file outfile for the wrapper wrap. File outfile is the recipient of all the writes done by this method. It then writes the start of a module definition for module wrap along with its module I/O list. Next, it writes any other signal declarations. For an embodiment of this invention that allows local signals to be defined, it writes those statements that define and drive the local signals. Next, it writes the statements to drive the outputs and any other signals that were created in module wrap and are not associated with a local signal. After this, it writes any flops that were created to handle delays within the wrapper for an embodiment of this invention that supports delays. Afterward, for an embodiment of this invention that allows constraint modules, it writes any instances of those constraint modules that were created in it. Next, it writes the instance of the wrapper instance, either of the reference model if wrap is the reference wrapper or of the design module if wrap is the design wrapper. Finally, it writes the ending of the definition of module wrap and closes file outfile before exiting.

Figure 32:
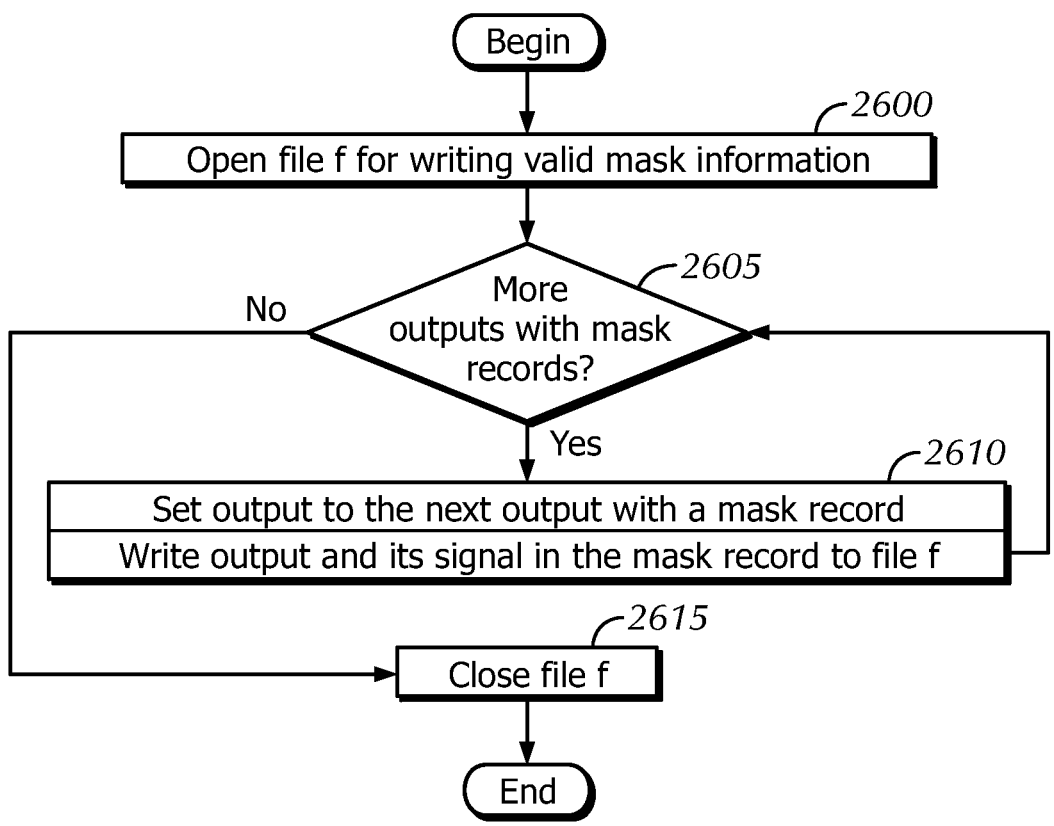
FIG. 32 illustrates the method of Box 2430 of FIG. 30.

FIG. 32 illustrates the method of Box 2430 of FIG. 30. The purpose of this method is to write the information about valid masks for an embodiment of this invention that supports valid masks.

This method starts in Box 2600 by opening file f which is to contain the information about valid masks. We then move to Box 2605, which asks if there are unprocessed primary outputs of the reference wrapper that have mask records. If there are not, we advance to Box 2615, which closes file f, and exit; otherwise, we go to Box 2610. Here, we set output to the next unprocessed output of the reference wrapper that has a mask record and write to file f the output output together with its associated signal in the mask record for output output. We then return to Box 2605.

To summarize, this invention is a method to prepare re-architected digital logic designs for sequential equivalence checking. This method is applicable when an existing "golden" design is optimized for higher performance, including changing the boundaries of levels within a design hierarchy. Without such a method, the optimizations would need to remain within a single hierarchical boundary, since equivalence checking tools require a one-to-one mapping between ports when proving two designs are equivalent. The method is also able to handle arbitrary encodings of reference signals to produce design signals and retiming of signals.

Other embodiments of the present invention will be apparent to those skilled in the art after considering this disclosure or practicing the disclosed invention. The specification and examples above are exemplary only, with the true scope of the present invention being determined by the following claims.

I claim the following invention:

1. A method for preparing re-architected integrated circuit (IC) designs for sequential equivalence checking, the method comprising:
   providing a description of an IC design module that includes a plurality of ports;
   providing a description of an IC reference model that includes a sub-circuit that matches the IC design module and a hierarchy of one or more reference modules, wherein each of said reference modules includes a plurality of internal signals;
   a computer creating a configuration file that includes an instance definition, wherein said instance definition contains a plurality of port definitions, each said port definition contains the name of a port of said IC design module and a reference connection, and said reference connection contains a Boolean combination of a plurality of signals within a plurality of reference modules and the Boolean constants 0 and 1;
   the computer generating a plurality of files based upon said configuration file;
   wherein said plurality of files includes:
     a reference wrapper file that encapsulates the IC reference model and includes a first set of primary inputs and outputs;
     a design wrapper file that encapsulates the IC design module and includes a second set of primary inputs outputs, wherein said second set of primary inputs and outputs is identical to said first set of primary inputs and outputs; and
     one or more hierarchical override files for verifying said IC design module against said IC reference model, wherein each of said hierarchical override files modifying an individual module within the hierarchy of one or more reference modules of said IC reference model by adding one or more additional ports to access internal signals within said individual module;
   wherein said reference wrapper file is sequentially equivalent to said design wrapper file as a result of said IC design module correctly implementing the sub-circuit of said IC reference model specified by said configuration file, and as modified by said hierarchical override files.

2. The method of claim 1, wherein each said port definition within said configuration file further specifies that said reference connection be delayed by an integral number of clock cycles, where said integral number may be positive, negative or zero.

3. The method of claim 1, wherein each said port definition within said configuration file further specifies an output valid mask, said output valid mask containing a Boolean combination of a plurality of signals within a plurality of reference modules and the Boolean constants 0 and 1, where sequential equivalence of said port is not required whenever said output valid mask is Boolean 0.

4. The method of claim 1, wherein said configuration file further contains logic to define and drive one or more local signals within the wrapper files and wherein said Boolean combination further contains references to said local signals.

5. The method of claim 1, wherein said configuration file further contains one or more sub-instance definitions, wherein each said sub-instance definition contains a path to a sub-instance of the IC design module and a plurality of port definitions, each said port definition contains the name of a port of said sub-instance and a reference connection, and said reference connection contains the hierarchical path to an internal signal within the IC reference model, where the logic of said sub-instance is removed from the design wrapper and the input ports of said sub-instance are created as output ports of the wrappers and the output ports of said sub-instance are created as input ports of the wrappers.

6. The method of claim 1, wherein said configuration file further contains one or more input constraint module definitions, wherein each input constraint module definition refers to an IC module containing a plurality of ports, wherein each port refers to an internal signal within the IC reference model, where an instance of said input constraint module is created within the wrapper files for each internal signal within the IC reference model referred to by an output port of said constraint module and where each reference to said internal signal within a reference connection uses said output port of said constraint module instead of said internal signal.

7. A system for preparing re-architected integrated circuit (IC) designs for sequential equivalence checking, where the IC designs include a description of IC design module that includes a plurality of ports, and a description of an IC reference model that includes a sub-circuit that matches the IC design module and a hierarchy of one or more reference modules, each including a plurality of internal signals, the system comprising:
- a processor;
- a storage device coupled to the processor;
- wherein the processor is configured to execute instructions stored on the storage device to:
  - create a configuration file that includes an instance definition, wherein said instance definition contains a plurality of port definitions, each said port definition contains the name of a port of said IC design module and a reference connection, and said reference connection contains a Boolean combination of a plurality of signals within a plurality of reference modules and the Boolean constants 0 and 1;
  - generate a plurality of files based upon said configuration file, wherein said plurality of files includes:
    - a reference wrapper file that encapsulates the IC reference model and includes a first set of primary inputs and outputs;
    - a design wrapper file that encapsulates the IC design module and includes a second set of primary inputs outputs, wherein said second set of primary inputs and outputs is identical to said first set of primary inputs and outputs; and
    - one or more hierarchical override files for verifying said IC design module against said IC reference model, wherein each of said hierarchical override files modifying an individual module within the hierarchy of one or more reference modules of said IC reference model by adding one or more additional ports to access internal signals within said individual module;
    - wherein said reference wrapper file is sequentially equivalent to said design wrapper file as a result of said electrical IC design module correctly implementing the sub-circuit of said IC reference model specified by said configuration file, and as modified by said hierarchical override file.

8. The system of claim 7, wherein each said port definition within said configuration file further specifies that said reference connection be delayed by an integral number of clock cycles, where said integral number may be positive, negative or zero.

9. The system of claim 7, wherein each said port definition within said configuration file further specifies an output valid mask, said output valid mask containing a Boolean combination of a plurality of signals within a plurality of reference modules and the Boolean constants 0 and 1, where sequential equivalence of said port is not required whenever said output valid mask is Boolean 0.

10. The system of claim 7, wherein said configuration file further contains logic to define and drive one or more local signals within the wrapper files and wherein said Boolean combination further contains references to said local signals.

11. The system of claim 7, wherein said configuration file further contains one or more sub-instance definitions, wherein each said sub-instance definition contains a path to a sub-instance of the electrical design module and a plurality of port definitions, each said port definition contains the name of a port of said sub-instance and a reference connection, and said reference connection contains the hierarchical path to an internal signal within the IC reference model, where the logic of said sub-instance is removed from the design wrapper and the input ports of said sub-instance are created as output ports of the wrappers and the output ports of said sub-instance are created as input ports of the wrappers.

12. The system of claim 7, wherein said configuration file further contains one or more input constraint module definitions, wherein each input constraint module definition refers to an IC module containing a plurality of ports, wherein each port refers to an internal signal within the IC reference model, where an instance of said input constraint module is created within the wrapper files for each internal signal within the IC reference model referred to by an output port of said constraint module and where each reference to said internal signal within a reference connection uses said output port of said constraint module instead of said internal signal.

13. A computer readable storage device including program instructions executable by a computing device to perform a method for preparing re-architected integrated circuit (IC) designs for sequential equivalence checking, where the IC designs include a description of an IC design module that includes a plurality of ports, and a description of IC reference model that includes a sub-circuit that matches the IC design module and a hierarchy of one or more reference modules, each including a plurality of internal signals, the method comprising:
- creating a configuration file that includes an instance definition, wherein said instance definition contains a plurality of port definitions, each said port definition contains the name of a port of said IC design module and a reference connection, and said reference connection contains a Boolean combination of a plurality of signals within a plurality of reference modules and the Boolean constants 0 and 1;
- generating a plurality of files based upon said configuration file, wherein said plurality of files includes:
  - a reference wrapper file that encapsulates the IC reference model and includes a first set of primary inputs and outputs;
  - a design wrapper file that encapsulates the IC design module and includes a second set of primary inputs outputs, wherein said second set of primary inputs and outputs is identical to said first set of primary inputs and outputs; and
  - one or more hierarchical override files for verifying said IC design module against said IC reference model, wherein each of said hierarchical override files modifying an individual module within the hierarchy of one or more reference modules of said IC reference model by adding one or more additional ports to access internal signals within said individual module;
  - wherein said reference wrapper file is sequentially equivalent to said design wrapper file as a result of said electrical IC design module correctly implementing the sub-circuit of said IC reference model specified by said configuration file, and as modified by said hierarchical override file.

14. The computer readable storage device of claim 13, wherein each said port definition within said configuration file further specifies that said reference connection be delayed by an integral number of clock cycles, where said integral number may be positive, negative or zero.

15. The computer readable storage device of claim 13, wherein each said port definition within said configuration file further specifies an output valid mask, said output valid mask containing a Boolean combination of a plurality of signals within a plurality of reference modules and the Boolean constants 0 and 1, where sequential equivalence of said port is not required whenever said output valid mask is Boolean 0.

16. The computer readable storage device of claim 13, wherein said configuration file further contains logic to define and drive one or more local signals within the wrapper files and wherein said Boolean combination further contains references to said local signals.

17. The computer readable storage device of claim 13, wherein said configuration file further contains one or more sub-instance definitions, wherein each said sub-instance definition contains a path to a sub-instance of the IC design module and a plurality of port definitions, each said port definition contains the name of a port of said sub-instance and a reference connection, and said reference connection contains the hierarchical path to an internal signal within the IC reference model, where the logic of said sub-instance is removed from the design wrapper and the input ports of said sub-instance are created as output ports of the wrappers and the output ports of said sub-instance are created as input ports of the wrappers.

18. The computer readable storage device of claim 13, wherein said configuration file further contains one or more input constraint module definitions, wherein each input constraint module definition refers to an IC module containing a plurality of ports, wherein each port refers to an internal signal within the IC reference model, where an instance of said input constraint module is created within the wrapper files for each internal signal within the IC reference model referred to by an output port of said constraint module and where each reference to said internal signal within a reference connection uses said output port of said constraint module instead of said internal signal.

19. The method as recited in claim 1, further comprising creating one or more sub-instance definitions within said configuration file and for each said sub-instance definition, creating a blackbox for which each input of said blackbox corresponds to a primary output of said reference wrapper and said design wrapper.

20. The system as recited in claim 7, wherein said processor is further configured to create within said configuration file one or more sub-instance definitions, each said sub-instance definition corresponding to a blackbox, and wherein each input of said blackbox corresponds to a primary output of said reference wrapper and said design wrapper.

* * * * *